(12) United States Patent
Toda

(10) Patent No.: US 7,928,352 B2
(45) Date of Patent: Apr. 19, 2011

(54) SOLID-STATE IMAGE CAPTURING DEVICE, IMAGE CAPTURING DEVICE, AND MANUFACTURING METHOD OF SOLID-STATE IMAGE CAPTURING DEVICE

(75) Inventor: Atsushi Toda, Kanagawa (JP)

(73) Assignee: Sony Corporation, Tokyo (JP)

( * ) Notice: Subject to any disclaimer, the term of this patent is extended or adjusted under 35 U.S.C. 154(b) by 66 days.

(21) Appl. No.: 11/903,953

(22) Filed: Sep. 25, 2007

(65) Prior Publication Data

US 2008/0087800 A1   Apr. 17, 2008

(30) Foreign Application Priority Data

Oct. 4, 2006   (JP) ................................ 2006-272597

(51) Int. Cl.
*H01L 31/00* (2006.01)
*H01L 33/00* (2006.01)

(52) U.S. Cl. ...................... 250/208.1; 257/292; 257/440

(58) Field of Classification Search .............. 250/208.1, 250/214.1; 348/294, 311; 257/291, 292, 257/431, 440, 450, 463, 464

See application file for complete search history.

(56) References Cited

U.S. PATENT DOCUMENTS

| | | | | |
|---|---|---|---|---|
| 5,391,882 A * | 2/1995 | Rhiger | ...................... | 250/370.13 |
| 5,880,510 A * | 3/1999 | Cockrum et al. | ............. | 257/442 |
| 5,965,875 A * | 10/1999 | Merrill | ........................... | 250/226 |
| 6,097,074 A * | 8/2000 | Takakura | ....................... | 257/440 |
| 6,191,044 B1 * | 2/2001 | Yu et al. | ......................... | 438/713 |
| 6,274,443 B1 * | 8/2001 | Yu et al. | ......................... | 438/299 |
| 6,548,833 B1 * | 4/2003 | Lin et al. | ......................... | 257/89 |
| 6,731,397 B1 * | 5/2004 | Merrill et al. | ................. | 358/1.16 |
| 6,934,050 B2 * | 8/2005 | Merrill et al. | ................. | 358/1.16 |
| 6,956,273 B2 * | 10/2005 | Koizumi | ........................ | 257/440 |
| 7,132,724 B1 * | 11/2006 | Merrill | ........................... | 257/440 |
| 7,154,157 B2 * | 12/2006 | Bradski et al. | ................. | 257/440 |
| 7,345,703 B2 * | 3/2008 | Lee | ................................ | 348/272 |
| 7,521,737 B2 * | 4/2009 | Augusto | ........................ | 257/233 |
| 7,535,073 B2 * | 5/2009 | Ezaki | ............................ | 257/440 |
| 2003/0189237 A1 * | 10/2003 | Koizumi | ........................ | 257/461 |
| 2004/0262651 A1 * | 12/2004 | Mouli | ............................ | 257/290 |
| 2005/0001248 A1 * | 1/2005 | Rhodes | .......................... | 257/292 |
| 2005/0167709 A1 * | 8/2005 | Augusto | ........................ | 257/292 |
| 2006/0049464 A1 * | 3/2006 | Rao | ................................. | 257/371 |
| 2007/0201738 A1 * | 8/2007 | Toda et al. | ..................... | 382/144 |
| 2008/0087800 A1 * | 4/2008 | Toda | .......................... | 250/214 C |
| 2008/0246063 A1 * | 10/2008 | Liu et al. | ........................ | 257/290 |
| 2009/0212383 A1 * | 8/2009 | Ezaki | ............................ | 257/440 |

(Continued)

FOREIGN PATENT DOCUMENTS

JP     64-074762     3/1989

(Continued)

*Primary Examiner* — John R Lee
(74) *Attorney, Agent, or Firm* — Robert J. Depke; Rockey, Depke & Lyons, LLC

(57) ABSTRACT

A solid-state image capturing device includes a first detecting unit for detecting a first wavelength component and a second detecting unit for detecting a second wavelength component which has a longer wavelength than at least the first wavelength component and wherein in a depth direction, an active region where a first type dopant of the second detecting unit is located is deeper than an active region where a first electroconductive type dopant of the first detecting unit is located. A signal processor modifies an output signal from at least one detecting unit based on a received signal quantity at another detecting unit and a type of filter above at least one of the detecting units.

6 Claims, 14 Drawing Sheets

U.S. PATENT DOCUMENTS

2009/0215220 A1 * 8/2009 Toda .............................. 438/87

FOREIGN PATENT DOCUMENTS

| JP | 04-088784 | 3/1992 |
| JP | 08-227898 | 9/1996 |
| JP | 2001-326341 | 11/2001 |
| JP | 2003-274422 | 9/2003 |
| JP | 2004-031878 | 1/2004 |
| JP | 2005-332925 | 12/2005 |
| WO | WO 2006-003807 | 1/2006 |

* cited by examiner

FIG. 2

(A) ARRAY MODE 1

| G | B | G | R | G | B | G | R |
|---|---|---|---|---|---|---|---|
| A | G | A | G | A | G | A | G |
| G | R | G | B | G | R | G | B |
| A | G | A | G | A | G | A | G |
| G | B | G | R | G | B | G | R |
| A | G | A | G | A | G | A | G |
| G | R | G | B | G | R | G | B |
| A | G | A | G | A | G | A | G |

(B) ARRAY MODE 2

| A | B | A | R | A | B | A | R |
|---|---|---|---|---|---|---|---|
| G | A | G | A | G | A | G | A |
| A | R | A | B | A | R | A | B |
| G | A | G | A | G | A | G | A |
| A | B | A | R | A | B | A | R |
| G | A | G | A | G | A | G | A |
| A | R | A | B | A | R | A | B |
| G | A | G | A | G | A | G | A |

R: RED PIXEL 12R / RED FILTER 14R
B: BLUE PIXEL 12B / BLUE FILTER 14B
G: GREEN PIXEL 12G / GREEN FILTER 14G
A: WIDE WAVELENGTH REGION PIXEL 12A / WHITE FILTER 14W OR NO FILTER

RED PIXEL 12R, GREEN PIXEL 12G, BLUE PIXEL 12B → VISIBLE LIGHT DETECTING PIXEL 12VL

(C) ARRAY MODE 3

| G | B | G | R | G | B | G | R |
|---|---|---|---|---|---|---|---|
| BK | G | BK | G | BK | G | BK | G |
| G | R | G | B | G | R | G | B |
| BK | G | BK | G | BK | G | BK | G |
| G | B | G | R | G | B | G | R |
| BK | G | BK | G | BK | G | BK | G |
| G | R | G | B | G | R | G | B |
| BK | G | BK | G | BK | G | BK | G |

(D) ARRAY MODE 4

| BK | B | BK | R | BK | B | BK | R |
|---|---|---|---|---|---|---|---|
| G | BK | G | BK | G | BK | G | BK |
| BK | R | BK | B | BK | R | BK | B |
| G | BK | G | BK | G | BK | G | BK |
| BK | B | BK | R | BK | B | BK | R |
| G | BK | G | BK | G | BK | G | BK |
| BK | R | BK | B | BK | R | BK | B |
| G | BK | G | BK | G | BK | G | BK |

R: RED PIXEL 12R / RED FILTER 14R
B: BLUE PIXEL 12B / BLUE FILTER 14B
G: GREEN PIXEL 12G / GREEN FILTER 14G
BK: INFRARED LIGHT DETECTING PIXEL 12IR / BLACK FILTER 14BK

RED PIXEL 12R, GREEN PIXEL 12G, BLUE PIXEL 12B → VISIBLE LIGHT DETECTING PIXEL 12VL

WAVELENGTH DEPENDENCY OF OPTICAL ABSORPTION COEFFICIENT OF SEMICONDUCTOR

RELATION BETWEEN ABSORPTION COEFFICIENT AND ABSORPTANCE

SOLID-STATE IMAGE CAPTURING DEVICE, IMAGE CAPTURING DEVICE, AND MANUFACTURING METHOD OF SOLID-STATE IMAGE CAPTURING DEVICE

CROSS REFERENCES TO RELATED APPLICATIONS

The present invention contains subject matter related to Japanese Patent Application JP 2006-272597 filed in the Japanese Patent Office on Oct. 4, 2006, the entire contents of which are incorporated herein by reference.

BACKGROUND OF THE INVENTION

1. Field of the Invention

The present invention relates to a solid-state image capturing device, an image capturing device, and a manufacturing method of a solid-state image capturing device. More specifically, the present invention relates to a signal obtaining technique which is suitable for being applied to a solid-state image capturing device or the like employing a physical amount distribution detecting semiconductor device wherein multiple unit components having sensitivity as to an electromagnetic wave input from the outside such as light, radiation, or the like, are arrayed, and a physical amount distribution converted into an electric signal by the unit components can be read out as an electric signal. For example, the present invention relates to applying to a solid-state image capturing device capable of image capturing using a wavelength component (e.g., infrared light) other than visible light.

2. Description of the Related Art

Physical amount distribution detecting semiconductor devices made up of multiple unit components (e.g., pixels) being arrayed in a linear or matrix shape which have sensitivity as to physical amount change such as an electromagnetic wave input from the outside such as light, radiation, or the like have been employed for various fields.

For example, in the field of picture devices, CCD (Charge Coupled Device) type or MOS (Metal Oxide Semiconductor) or CMOS (Complementary Metal-oxide Semiconductor) type solid-state image capturing devices, which detect change in light (one example of an electromagnetic wave) which is an example of a physical amount, have been employed. These read out a physical amount distribution converted into an electric signal by unit components (pixels in a solid-state image capturing device) as an electric signal.

For example, a solid-state image capturing device detects an electromagnetic wave to be externally input such as light, radiation, or the like, using a photodiode, which is a photoelectric conversion element (receiving element; photo sensor) provided in an image capturing portion (pixel portion) which is a device portion, generates and stores signal charge, and reads out this stored signal charge (photoelectron) as image information.

Now, in the event of an arrangement wherein a color image is obtained, employing an image sensor is a current mainstream wherein a color filter such as transmitting a particular wavelength component alone is disposed for each pixel, and necessary color components are restored with a set of multiple pixels, thereby distinguishing a color.

Specifically, as for a set of color filters, a color is distinguished by a color array employing subtractive color filters of red (R), green (G), and blue (B) which are three primary colors, and a semiconductor layer configured to detect light is provided under each color filter, thereby detecting each of three primary color lights separately which have been transmitted through filters. Also, employing an array serving as a luminance signal obtaining array wherein white (Y), red (R), green (G), and blue (B) are combined can be considered. These arrays are all called Bayer arrays.

With a solid-state image capturing device employing a single-device color system, each pixel thus has only a single color component, so for example, interpolation processing is performed employing the color information of surrounding pixels, whereby demosaic processing for restoring color components necessary for each of the pixels is performed (see Japanese Unexamined Patent Application Publication No. 04-088784).

On the other hand, in recent years, an arrangement has also been considered wherein a new application is realized by detecting components other than visible light components, which cannot be realized in the case of detecting only visible light components.

As for one example, the present assignee has proposed an arrangement wherein a visible light component and an infrared light component are simultaneously detected, and the detected infrared component is employed, thereby realizing high sensitivity, and suppressing the infrared light component from leaking into the visible light component, even with a single-device system.

However, we have found that with an existing solid-state image capturing device, a semiconductor layer where a detecting unit such as a photodiode is disposed principally has a device configuration optimized for detection of visible light, which makes it difficult to obtain sufficient performance since, the detection sensitivity of infrared light component is low with an arrangement for simply detecting a visible component and an infrared light component at the same time using such a semiconductor layer.

SUMMARY OF THE INVENTION

It has been found to be desirable to provide a device configuration capable of improving the detection sensitivity of a long wavelength side component, and the manufacturing method thereof.

With a first arrangement according to an embodiment of the present invention, a solid-state image capturing device is configured so as to include a first detecting unit configured to detect a first wavelength region component (typically, visible light component) within an electromagnetic wave, and a second detecting unit configured to detect a second wavelength region component (typically, infrared light component at a longer wavelength side as to visible light) which is at the longer wavelength side than at least the first wavelength region component, and also in the depth direction from the surface of a semiconductor board substrate an active region where a first electroconductive type dopant of the second detecting unit is formed reaches a portion deeper than an active region where the first electroconductive type dopant of the first detecting unit is formed.

That is to say, the active region of the second detecting unit reaches a portion which is deeper than a portion where the active region of the first detecting unit reaches. In other words, in the event of employing a solid-state image capturing device wherein the first detecting unit and the second detecting unit are mixed, only the second detecting unit has a configuration where the first electroconductive type dopant is selectively implanted deeply.

While details will be described later by way of embodiment, the absorption coefficient of an electromagnetic wave with a semiconductor layer has property wherein a component at a long wavelength side is smaller than a component at a short wavelength side. This means that with a component at a short wavelength side within an electromagnetic wave entering the semiconductor layer, the absorption percentage at the semiconductor layer is great, so the degree of being absorbed at the surface of the semiconductor layer is great, but on the other hand, with a component at a long wavelength side, the absorption percentage at the semiconductor layer is small, so the degree of being absorbed at the surface of the semiconductor layer is small, thereby reaching a deeper portion.

Accordingly, setting a deep portion of the semiconductor layer to the active region of the second detecting unit configured to detect a long wavelength side enables even more signal charges to be obtained as compared with the case of not applying this arrangement, whereby detection sensitivity as to a long wavelength can be improved.

Also, with a second arrangement according to an embodiment the present invention, an active region where a first electroconductive type dopant of a detecting unit is formed in the depth direction from the surface of the semiconductor substrate is subjected to modulation doping of which the concentration of a dopant differs depending on a depth position, whereby the deeper from the surface side of the semiconductor substrate, the lower the concentration of the dopant becomes.

In the event of reading out signal charge generated at the semiconductor layer, signal charges generated at a shallow portion can be read out at a high speed, but it takes time to read out signal charge generated at a deep portion. Accordingly, the active region is subjected to modulation doping whereby the deeper from the surface side of the semiconductor substrate, the lower the concentration of the dopant becomes, and thus, an internal field due to the inclination of the band can be generated so as to readily read out signal charge from the deep side toward the surface, whereby the signal charge generated at the deep side within the semiconductor layer can be moved at a high speed to the surface side of the semiconductor substrate using the electric field having a slope.

Note that this second arrangement can also be combined with the first arrangement. In this case, it is desirable to apply this arrangement to at least the second detecting unit side configured to detect a long wavelength side, which forms the active region up to a deep portion of the semiconductor layer.

That is to say, with regard to the second detecting unit side, it is desirable to improve the sensitivity at a long wavelength side by forming the first electroconductive type dopant up to a deep portion of the semiconductor layer, and also to readily move the signal charge generated at a deep side within the semiconductor layer to the surface side using the electric field to enable readout by gradually reducing the dopant concentration in the depth direction from the surface side.

Also, in the event of applying the second arrangement, it is further desirable to form the second electroconductive type dopant such that the peak position of the concentration of the second electroconductive type dopant is deeper than the peak position of the concentration of the first electroconductive type dopant. According to the second electroconductive type dopant, the inclination of the band at a deep side of the semiconductor layer is increased, whereby the advantage of the modulation doping can be further improved.

Also, a manufacturing method of a solid-state image capturing device according to the present invention is particularly a method for manufacturing a solid-state image capturing device of the first arrangement according to the present invention, first, a control film configured to restrict the implantation depth as to the implantation of the first electroconductive type dopant is formed on the surface at a position corresponding to the first detecting unit of the semiconductor substrate beforehand, and also an opening portion of the control film is formed on the surface at a position corresponding to the second detecting unit beforehand.

Note that the opening portion of the control film does not mean only that there is no control film at all, and preferably reduces the advantage of the control film at the second detecting unit side as compared with the advantage at the first detecting unit side.

For example, a thinner control film may be provided as compared with the first detecting unit side. That is to say, in the event of forming a control film on the surface of the semiconductor substrate, an arrangement is made so as to increase the advantage of the control film at the first detecting unit side, and also so as to decrease the advantage of the control film thereof at the second detecting unit side.

After that, with the first detecting unit and the second detecting unit, the active regions where the first electroconductive type dopant is formed are formed simultaneously by irradiating the first electroconductive type dopant from the surface side of the semiconductor substrate.

When irradiating the entire surface of the first electroconductive type dopant from the surface side of the semiconductor substrate, energy is absorbed due to the advantage of the control film at the first detecting unit side, so the range distance of the first electroconductive type dopant is reduced, but there is no control film at the second detecting unit side, so energy is not absorbed, and accordingly, the range distance of the first electroconductive type dopant becomes the original range distance of the irradiation energy. Thus, a configuration can be realized such that in the depth direction from the surface of the semiconductor substrate, the active region where the first electroconductive type dopant of the second detecting unit is formed reaches a portion deeper than the valid region where the first electroconductive type dopant of the first detecting unit is formed.

Also, at this time, further applying a technique for gradually changing the irradiation intensity of the first electroconductive type dopant enables a configuration subjected to the modulation doping of the second arrangement to be realized. This provides an advantage wherein not only the second detecting unit but also the first detecting unit are subjected to modulation doping simultaneously.

According to the first arrangement of an embodiment of the present invention, an active region of a second detecting unit configured to detect a long wavelength side is formed up to a deeper portion of a semiconductor layer as compared with an active region of a first detecting unit, whereby the detection sensitivity as to a long wavelength can be improved.

In the event of manufacturing a solid-state image capturing device having such a first arrangement, a control film configured to restrict the implantation depth as to the implantation of a first electroconductive type dopant is formed on the surface at a position corresponding to the first detecting unit beforehand, an opening portion is formed on the surface at a position corresponding to the second detecting unit beforehand, and the first electroconductive type dopant is irradiated from the surface side of the semiconductor substrate, whereby the first detecting unit and the second detecting unit each having a different depth position of an active region where the first electroconductive type dopant is formed can be formed simultaneously.

According to the second arrangement of an embodiment of the present invention, an active region where a first electroconductive type dopant of a detecting unit is formed is subjected to modulation doping whereby the deeper from the surface side of the semiconductor substrate, the lower the concentration of the dopant becomes, so an internal field due to the inclination of the band so as to readily read out signal charge from a deep side toward the surface can be generated. As a result thereof, the signal charge generated at a deep side within the semiconductor layer can be moved to the surface side of the semiconductor substrate at a high speed using an electric filed having a slope. Forming the active region of the detecting unit up to a deep side of the semiconductor layer can cause a problem wherein it takes time to read the signal charge generated at the deep side within the semiconductor layer, but the problem thereof can be eliminated.

BRIEF DESCRIPTION OF THE DRAWINGS

FIG. 2 is a diagram illustrating one example of a specific example of a color layout of color separation filters;

DESCRIPTION OF THE PREFERRED EMBODIMENTS

Figure 1:
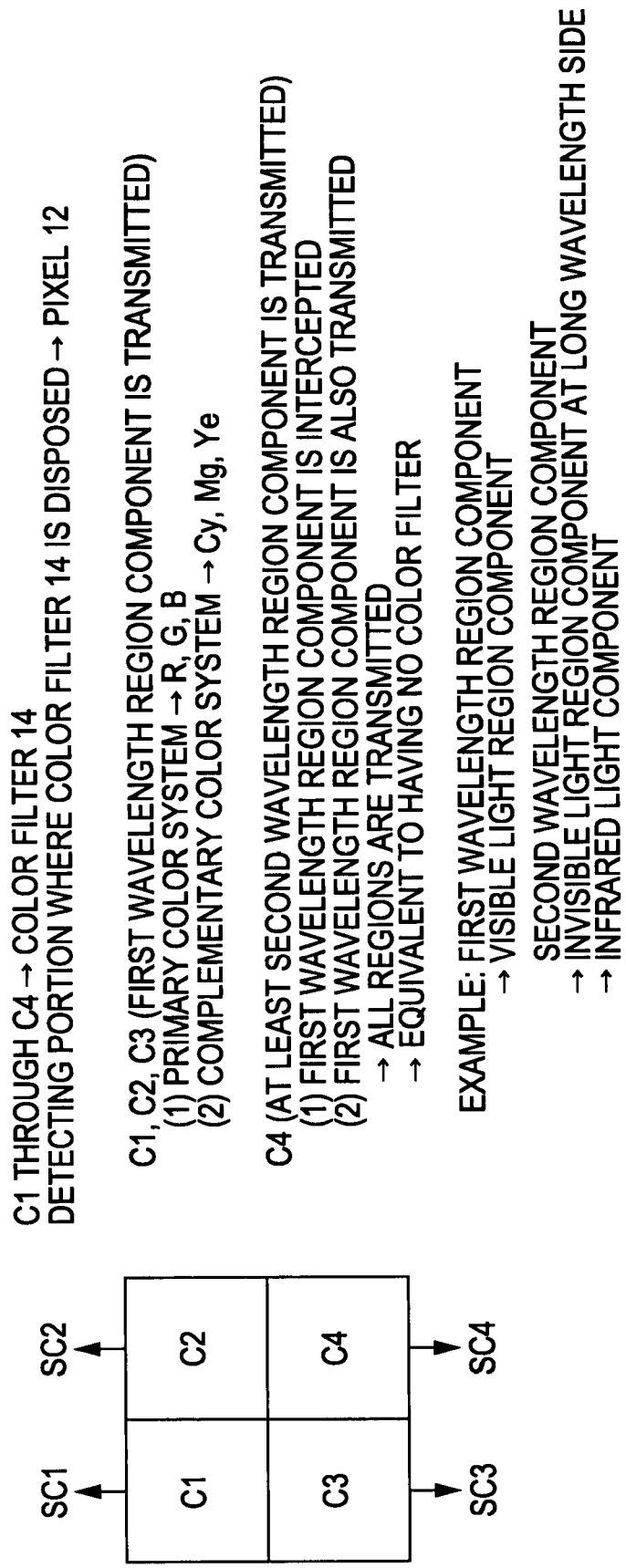
FIG. 1 is a diagram illustrating the basic configuration of a layout example of color separation filters employed for the present embodiment.

Description will be made in detail below regarding an embodiment of the present invention with reference to the drawings.
<Basic Concept>
FIGS. 1 and 2 are diagrams illustrating color layout examples of color separation filters employed for the present embodiment. Here, FIG. 1 is a diagram illustrating the basic configuration of a color layout example of color separation filters, and FIG. 2 is a diagram illustrating one example as a specific example.

A color layout of color separation filters is basically a layout which always enables each of a visible color image and an infrared light image to be obtained independently. For example, as shown in FIG. 1, four types of color filters of color filters C1, C2, and C3 (each transmits a first wavelength region component which is a selectively specific wavelength region) for visible light color image which are filters for three wavelength regions (color components), and a color filter C4 having a different filter property from the color filters C1, C2, and C3, are allocated regularly (in a tetragonal lattice manner in the present example). Note that in the event of the present example, the first wavelength region component becomes a visible light region component. The C1, C2, C3, and C4 are collectively referred to as a color filter 14, and a detecting unit corresponding thereto is referred to as a pixel 12.

Each component can be detected independently by being detected at a corresponding detecting unit such as a photodiode through the color filters C1, C2, C3, and C4. A detecting unit where the color filters C1, C2, and C3 are disposed is a first detecting unit, and a detecting unit where the color filter C4 is disposed is a second detecting unit. Also, the detecting unit where the color filters C1, C2, and C3 are disposed is configured to divide a first wavelength region (visible light region) by wavelength, and detect these to obtain a color image so as to further handle color separation.

Now, let us say that the color filters C1, C2, and C3 are ideally primary color filters having the transmittance of a color component within the visible light band of approximately 1, and the transmittance at the others of approximately zero. Alternatively, let us say that the color filters C1, C2, and C3 are ideally complementary color filters having the transmittance of a color component within the visible light band of approximately zero, and the transmittance at the others of approximately 1.

Color filters of a complementary color system are high in sensitivity as compared with color filters of a primary color system, so employing color filters of a complementary color system wherein the transmission light of a visible region is the complementary color of each of three primary colors enables the sensitivity of an image capturing device to be increased. Conversely, employing color filters of a primary color system enables the color signal of a primary color to be obtained without performing difference processing, which provides an advantage wherein the signal processing of a visible light color image is simplified.

Note that the transmittance of "approximately 1" means an ideal state, but actually, it is unavoidable to make the color filters changed into subtractive color filters whereby the transmittance of light is attenuated, and consequently the transmittance is relatively decreased. Even in this case, it is desirable that the transmittance at the wavelength region thereof is markedly greater than the transmittance at the other wavelength regions. There may be transmittance which is not "1" in part. Also, the transmittance of "approximately 0" also means an ideal state, and it is desirable that the transmittance at the wavelength region thereof is markedly greater than the transmittance at the other wavelength regions. There may be transmittance which is not "0" in part.

Also, it is desirable for each of the primary color system and the complementary color system allow passing through of the wavelength region component of a predetermined color (primary color or complementary color) within a visible light region, but whether to permit passing through of the ultraviolet light region and the infrared light region, i.e., the transmittance as to infrared light and ultraviolet light, is not an issue. It is needless to say that the transmittance as to infrared light and ultraviolet light is preferably approximately zero, which is advantageous in respect of color reproducibility.

For example, with each color filter commonly employed now, the transmittance is high as to each of R, G, and B, and the transmittance of the other colors (if R, G and B) is low, but the transmittance outside the visible light band is not regulated, normally higher than the transmittance of the other colors (if R, G and B), for example, each filter has sensitivity in the infrared light region, and there is the transmission of light at the infrared light region. However, even with such property wherein the transmittance is high outside the visible light band, the present embodiment is not influenced in principle, though there is a problem of color reproducibility. It is needless to say that an arrangement is preferably employed wherein an infrared light component is eliminated regarding the first wavelength region.

On the other hand, the color filter C4 preferably has property wherein the pixel 12 where the color filter C4 is disposed serves as a pixel (a typical example is an infrared light detecting pixel 12IR) configured to detect a component at a longer wavelength side (a typical example is an infrared light component) of components other than visible light (invisible light component). That is to say, the color filter C4 may be a filter (so-called visible light cut filter) which permits passing through of no principal component passing through the color filters C1, C2, and C3 (i.e., visible light component) but only the second wavelength region (infrared light in the present example), may be a filter, as a second technique, which passes through all over the regions from the first wavelength region (visible light in the present example) to the second wavelength region (infrared light in the present example).

In the event of employing the second technique, the color filter C4 is preferably a filter for a predetermined wavelength region so as to make at least the second detecting unit a pixel of which the use efficiency of light is high as compared with the detecting unit of the color filters C1, C2, and C3, and typically is preferably a filter which permits passing of all components from the first wavelength region (visible light in the present example) to the infrared light region. With the present embodiment, the color filter C4 is referred to as a full band pass filter.

For example, a white filter is preferably employed as the color filter C4 wherein the second detecting unit is configured to have sensitivity as to light up to infrared light in addition to blue to red which is the visible light band. In the case of the second technique, in that the components of full wavelength from visible light to infrared light (particularly, near-infrared light) are passed through, the color filter C4 can be configured so as to provide no color filter for all practical purposes. With the present embodiment, let us say that detection is made at the second detecting unit "through the filter C4", thus including a configuration wherein no color filters is provided for all practical purposes.

Note that the first detecting unit (e.g., detecting unit such as a photodiode) which is a pixel where the color filters C1, C2, and C3 are disposed preferably has sensitivity at least as to visible light, does not need to have sensitivity as to near-infrared light, and rather, in respect of color reproducibility, it is desirable for the first detecting unit to have low sensitivity as to other than visible light components as low as possible.

On the other hand, in the case of the present example, the second detecting unit configured of a photodiode or the like where the color filter C4 is disposed needs to have sensitivity at least as to infrared light (including near-infrared light). Note that as a premise, the second detecting unit needs to detect infrared light which is one example of an invisible light region component, so it is necessary for infrared light to enter in the second detecting unit, and accordingly, image capturing is performed by eliminating an infrared light cut filter which has been employed in the past.

Also, in the event that the color filter C4 is a visible cut filter configured to permit passing through of only infrared light, the second detecting unit does not need to have sensitivity as to visible light, but in the event that the color filter C4 is a full band pass filter, the second detecting unit needs to have sensitivity as to visible light as well.

Also, the second detecting unit where the color filter C4 is disposed can be not only used as for physical information (infrared light image or wide wavelength region image in the present example) reproduction relating to the second wavelength region component obtained by the second detecting unit, but also used as a color correction pixel or sensitivity correction pixel as to a color signal for visible light color image reproduction obtained by the first detecting unit where the color filters C1, C2, and C3 are disposed. Consequently, the color filter C4 serves as a correction filter as to the color filters C1, C2, and C3.

For example, in the event of reproduction of a visible light color image, first, signal components SC1, SC2, and SC3 of the first wavelength region obtained from the first detecting unit where the color filters C1, C2, and C3 are disposed are divided and detected from the (infrared) components of the second wavelength region different from the components of the first wavelength region for all practical purposes. Also, a signal component SC4 of a predetermined wavelength region (infrared alone or all over the regions) including the second wavelength region (infrared) component is detected at another second detecting unit.

Also, further preferably, correction calculation (particularly, referred to as color reproduction correction calculation) of which color reproduction is more excellent is executed using the respective signal components SC1, SC2, and SC3, and the signal component SC4, or correction calculation (particularly, referred to as high sensitivity correction calculation) is executed so as to obtain a signal having more sensitivity.

For example, in the event that an infrared light component is leaked in a visible light component passing through the color filters C1, C2, and C3, in order to obtain a visible light color image having almost no influence of infrared light, for example, it is necessary to execute color correction calculation processing wherein an infrared light component is subtracted from blue, red, and green components detected at three color pixels R, G, and B which receive a visible light component with reference to the intensity of an infrared light component obtained through the color filter C4.

Also, in the event of employing a full band pass filter which enables passing through of a component of full wavelength from visible light to infrared light (particularly, near-infrared light) as the color filter C4, predetermined correction calculation processing (meaning high sensitivity correction processing here) is executed as to each detection signal output from the first detecting unit which detected the first wavelength region component through the color filters C1, C2, and C3 using a visible light component detected at the second detecting unit, whereby a visible light color image can be obtained with high sensitivity.

Also, in the event of employing a full band pass filter as the color filter C4, the second detecting unit can be configured of a high sensitivity pixel 12HS capable of obtaining an image signal of which the usage efficiency is high by employing a pixel of which the usage efficiency of light is higher than that of the detecting unit of the color filters C1, C2, and C3 for obtaining a color image, and a detecting signal (referred to as wide wavelength region signal SA) having high light usage efficiency output from the second detecting unit obtained through the color filter C4, which detected the second wavelength region component.

Now, in the event of employing a pixel of which the usage efficiency of light is high, first, as a first technique, let us say that the second wavelength region component includes almost the overall of the first wavelength region component (visible light region component), and also includes an invisible light region component (e.g., a violet light component at a short wavelength side, or the infrared light component at the long wavelength side) which is a component other than the visible light region component, which is the basic concept. This is a concept for improving the usage efficiency of light (electromagnetic wave) by employing a component other than the first wavelength region component.

Also, while detailed description will be omitted here, in the event of employing a pixel of which the usage efficiency of light is high, further preferably, as a second technique, while applying the above-mentioned first technique to the second wavelength region component, the first wavelength region component (visible light region component) can be made of a component becoming a pixel having sensitivity higher than that of each of the first detecting units which detected the first wavelength region component through the color filters C1, C2, and C3. This is a concept wherein with the second detecting unit, the first wavelength region component is detected with sensitivity higher than that of the first detecting unit, thereby further improving the usage efficiency of light (electromagnetic wave).

According to the second technique, a detection signal having high light usage efficiency output from the second detecting unit becomes a wide wavelength region signal including both of a so-called luminance signal component of a visible light portion, and an invisible light signal component, as a result thereof, a wide wavelength region image can be obtained wherein not only sensitivity is improved, but also resolution is high.

Note that in this case, correction calculation processing (meaning high sensitivity correction calculation processing here) is executed between a high sensitivity signal (one example of a detection signal) detected at the second detecting unit, and each detection signal output from each of the first detecting units which detected the first wavelength region component through the color filters C1, C2, and C3, thereby enabling a visible light color image to be obtained with high sensitivity as well.

Also, correction calculation processing (meaning color correction calculation processing here) is executed between a wide wavelength region signal (one example of a detection signal) detected at the second detecting unit, and each detection signal output from each of the first detecting units which detected the first wavelength region component through the color filters C1, C2, and C3, thereby enabling a visible light color image to be obtained with high color reproducibility as well.

Note that an image (here, infrared light image relating to infrared light) relating to the second wavelength region component can be obtained from the signal component SC4. At this time, in the event of employing a black filter as a visible light cut filter wherein the color filter C4 does not allow the primary components (i.e., visible light component), which pass through the color filters C1, C2, and C3, to pass therethrough, but allow the second wavelength region (infrared light in the present example) to pass therethrough, visible light can be absorbed with this black filter, only an infrared light component is obtained from the second detecting unit for infrared light, and the signal component SC4 itself represents an infrared light image. That is to say, consequently, an infrared light image of infrared light alone which receives almost no influence of visible light can be obtained even if difference processing is not performed with a visible light component obtained at the detecting unit through the color filters C1 through C3.

On the other hand, in the event that the color filter C4 is a full band pass filter which permits passing through of the components of all regions from the first wavelength region (visible light in the present example) to the second wavelength region (infrared light in the present example), it is necessary to subtract visible light image components obtained by the signal components SC1, SC2, and SC3 from the signal component SC4, thereby extracting an infrared light image alone.

That is to say, in the event that a visible light cut filter is not inserted at the light receiving surface side of a detecting region which receives infrared light, a visible light component is leaked in the detecting region side of infrared light, and a visible light image of this leaked component and an original infrared light image are mixed and obtained at the second detecting unit. In order to eliminate this mixed visible light image to obtain an infrared light image having almost no influence of visible light, for example, it is necessary to estimate a visible light component as a whole with reference to the intensity of blue, red, and green to be detected at three color pixels R, G, and B which receive a visible light component, and to execute calculation processing wherein a visible light component is subtracted from an infrared light component obtained through the color filter C4.

Note that in the event that the color filter C4 is a full band pass filter which permits passing through of the components of all regions from the first wavelength region (visible light in the present example) to infrared light, the signal component SC4 obtained at the second detecting unit having high light usage efficiency where the color filter C4 is disposed can also be employed instead of an existing luminance signal. An image mixed with visible light and invisible light may be obtained with no change. In this case, a component other than a visible light region can be employed at the time of the photography under a low illumination environment with few visible light components, so a signal level to be detected becomes greater than the case of a visible light component alone, whereby effective noise reduction can be realized.

However, in this case, the luminance signal level becomes great, which causes concern that the color reproducibility of a color image will deteriorate. A luminance component (wide wavelength region signal SA) includes an infrared light component, so color reproducibility deteriorates as compared with an arrangement wherein color analysis processing is performed based on only visible light data. This is caused by a phenomenon wherein even if color difference levels are the same, but luminance signal levels differ, and consequently the tone perceived visually is differently recognized. In order to avoid this, it is desirable to employ an infrared light component representing a luminance signal, and to subject the color component of the visible light band obtained through the color filters C1 through C3 to correction.

Thus, various types of information can be obtained, depending on whether the color filter C4 allows an infrared light component alone to pass therethrough, or also allows the visible light band to pass therethrough, and also unnecessary components can be reduced by executing the correction calculation.

Note that in the event of various types of correction calculation, as one example, it is desirable to obtain a visible color image and a near-infrared light image independently, by subjecting the signal output obtained at four types of wavelength regions (here, each pixel where the four types of color filters are disposed) to matrix calculation. The four types of color filters having individual filter property are disposed at each pixel of an image capturing device such as a photodiode or the like, and the output of each pixel where the four types of color filters are disposed are subjected to matrix calculation, whereby three-primary-color output for forming a visible light color image which receives almost no influence of near-infrared light, and output for forming a near-infrared light image which receives almost no influence of visible light, can be obtained independently and simultaneously.

Particularly, with regard to a visible color image, poorness in color reproduction due to leakage of infrared light is corrected by calculation processing, thereby enabling image capturing to be performed with high sensitivity at dark portions and also excellent color reproduction. A phenomenon wherein a red signal component which is close to infrared light becomes great, and a phenomenon wherein luminance increases at a red portion of a picture can be eased, and improvement in color reproducibility with low cost and increase in sensitivity at the time of low illumination can be balanced without employing a special image capturing device and mechanism.

Note that with regard to specific techniques of color correction calculation processing and high sensitivity correction calculation processing, description thereof will be omitted in the present Specification. Japanese Patent Application No. 2006-114081, Japanese Patent Application No. 2006-133412, Japanese Patent Application No. 2006-160718, Japanese Patent Application No. 2005-211002, and so forth, filed by the present assignee, can be referenced for further description of such specific techniques.

Also, as one example of a subtractive color filter, an optical member (so-called infrared light cut filter) made of expensive glass having thickness and weight does not need to be inserted before a sensor on an optical path of an image formation optical system. Eliminating the expensive infrared light cut filter enables the optical system to be reduced in weight and size, and also enables cost to be reduced markedly. It is needless to say that the insertion/extraction mechanism of an infrared light cut filter is unnecessary, so the device can be kept small.

Also, due to the infrared light cut filter becoming unnecessary, reduction in light transmittance by an infrared light cut filter can be eliminated, thereby achieving high sensitivity for just that much. Also, color image capturing is performed without an infrared light cut filter, whereby high sensitivity can be realized using the light of a near-infrared region effectively, while combining with a current signal processing circuit, and even at the time of low luminance color reproducibility becomes excellent, and further, improvement in color reproducibility can be furthered by applying color correction.

Poorness in color reproducibility of a visible light color image due to an infrared light component leaked in a visible light component can be readily corrected by calculation processing. Also, at the time of the correction calculation thereof, correction is not performed based on simple estimation such as an arrangement described in Japanese Unexamined Patent Application Publication No. 2003-70009, but the infrared light component is actually measured, and correction is performed using the information thereof, whereby correction can be applied with a suitable amount corresponding to the intensity of infrared light under an actual image capturing environment, and accordingly, correction accuracy is extremely good. Also, it is not necessary for a user to regulate the amount of correction in accordance with an image capturing environment, which improves usability.

<Specific Example of Color Filter Array>

Note that FIG. 1 illustrates a case wherein the repeat increments of color separation filter are two pixels by two pixels, but this is only an example, and in practice, the repeat increments of color separation filter and the layout mode of C1 through C4 need to be determined, for example, depending on whether to prioritize any of the resolution of a visible light image and the resolution of an infrared light image.

At this time, for example, a pixel for handling a wide wavelength region (wide wavelength region pixel 12A) is added to a visible light pixel of existing RGB primary color filters and Cy, Mg, Ye complementary color filters (or primary color filter G), but in practice, one of the visible light pixels will be substituted with the wide wavelength region pixel 12A, with the existing filter layout as the base. At this time, the layout mode of the wide wavelength region pixel 12A and a wavelength component pixel (e.g., green pixel 12G) which contributes to the resolution of a visible light image is devised, whereby the resolution of a visible light image can be prevented from being deteriorated, or the resolution of a wide wavelength region image (i.e., luminance image) obtained at the wide wavelength region pixel 12A can be prevented from being deteriorated.

For example, as with the existing arrangement, in the event of employing a color separation filter configuration where each color of the color filter 14 is disposed in a mosaic shape, the wide wavelength region pixel 12A where infrared light and visible light are mixed is disposed so as to form a mosaic pattern with a certain lattice interval, and also one pixel within the primary color system RGB or complementary color system Cy, Mg, Ye pixels of visible light is disposed so as to form a mosaic pattern with a certain lattice interval.

Here, "so as to form a mosaic pattern" means that when taking a certain color pixel as a pixel of interest, the color pixels thereof are arrayed in a lattice shape with a certain lattice interval. It is not indispensable for the color pixels thereof to be adjacent to each other. Note that as for a typical example in the case of employing a layout mode where color pixels are adjacent to each other, there is a layout mode wherein the squares of the wide wavelength region pixel 12A and the other color pixels are arrayed alternately so as to form a squares pattern (checkered pattern). Alternatively, there is a layout mode wherein the squares of one pixel within the primary color system RGB or complementary color system Cy, Mg, Ye pixels of visible light and the other color pixels are arrayed alternately so as to form a grid pattern (checkered pattern).

For example, in order to prevent the resolution of a visible color image from being deteriorated while employing the RGB primary color filters, it is desirable to maintain the layout density of G pixels of a visible light region, and substitute the remaining R and B pixels of the visible light region with the wide wavelength region pixel 12A. For example, such as a layout mode shown in (A) in FIG. 2, within a unit pixel matrix of two lines by two columns, first, a green pixel 12G where the color filter 14G configured to sense a green component of a visible light region is provided is disposed at an odd-line odd-column and an even-line even-column, and the wide wavelength region pixel 12A where the white filter 14W is provided or the color filter 14 is not provided is disposed at an even-line odd-column. The wide wavelength region pixel 12A is one example of a wide wavelength region signal obtaining device configured to obtain a light signal including an invisible light component such as visible light, infrared light, and so forth.

Also, with the odd'th unit pixel matrix in the line direction, a blue pixel 12B where the color filter 14B configured to sense a blue component of a visible light region is disposed at an odd-line even-column in the odd'th unit pixel matrix in the line direction, and a red pixel 12R where the color filter 14R configured to sense a red component of a visible light region is disposed at an odd-line even-column in the even'th unit pixel matrix in the line direction. With the even'th unit pixel matrix in the column direction, the placement of the blue pixel 12B and the placement of the red pixel 12R are inverted.

Note that the red pixel 12R, green pixel 12G, and blue pixel 12B will be collectively referred to as a visible light detecting pixel 12VL. The visible light detecting pixel 12VL is one example of a specific wavelength region signal obtaining device configured to divide a visible light signal such as RGB signals by wavelength to obtain the divided components.

In the case of the layout mode such as shown in A in FIG. 2, a checkered pattern layout mode is employed wherein the squares of one green pixel 12G and the other color pixels within the primary color system RGB pixels of visible light are arrayed alternately, whereby the layout density of the green pixel 12G greatly contributing to the resolution of a visible light color image can be set to the same as that of a Bayer array, which eliminates the deterioration of the resolution of a visible light color image obtained with a synthesized luminance signal.

However, the layout density of the red pixel 12R and blue pixel 12B becomes ½ as to a Bayer array, thereby deteriorating color resolution. However, human visual perception regarding colors deteriorates for red R and blue B as compared with green G, so this may be considered to be not problematic.

On the other hand, with regard to a wide wavelength region image (i.e., luminance image) obtained at the wide wavelength region pixel 12A contributing to a luminance signal, the layout density of the wide wavelength region pixel 12A becomes ½ as to the green pixel 12G configured to sense a green component of a visible light region, so the resolution of a luminance image deteriorates as compared with a visible color image in the case of employing a synthesized luminance signal synthesized based on each pixel signal obtained at the primary color pixels 12R, 12G, and 12B.

Also, in order to prevent the resolution deterioration of a wide wavelength region image (i.e., luminance image) obtained at the wide wavelength region pixel 12A, for example, as shown in a layout mode shown in B in FIG. 2, it is desirable to replace the green pixel 12G configured to sense a green component of a visible light region, and the wide wavelength region pixel 12A shown in A in FIG. 2. In this case, a checkered pattern layout mode is employed wherein the squares of the wide wavelength region pixel 12A and the other color pixels are arrayed alternately, whereby the layout density of the wide wavelength region pixel 12A can be set to the same as that of a Bayer array, which eliminates the deterioration of the resolution of a luminance image to be output. However, the layout density of the green pixel 12G greatly contributing to the resolution of a visible light color image becomes ½ as to the wide wavelength region pixel 12A, so the resolution of a visible light color image deteriorates as compared with the resolution of a luminance image obtained from the wide wavelength region pixel 12A. With regard to color resolution, both are the same.

Also, layout modes shown in C in FIG. 2 and D in FIG. 2 employing the black filter 14BK as the color filter C4 can be employed as well. Here, C in FIG. 2 is a layout mode wherein the wide wavelength region pixel 12A (white filter 14W or pixel including no filter) in A in FIG. 2 is replaced with the infrared light detecting pixel 12IR (pixel of black filter 14BK), and D in FIG. 2 is a layout mode wherein the wide wavelength region pixel 12A (white filter 14W or pixel including no filter) in B in FIG. 2 is replaced with the infrared light detecting pixel 12IR (pixel of black filter 14BK).

<Spectral Characteristics of Filter>

Figure 3:
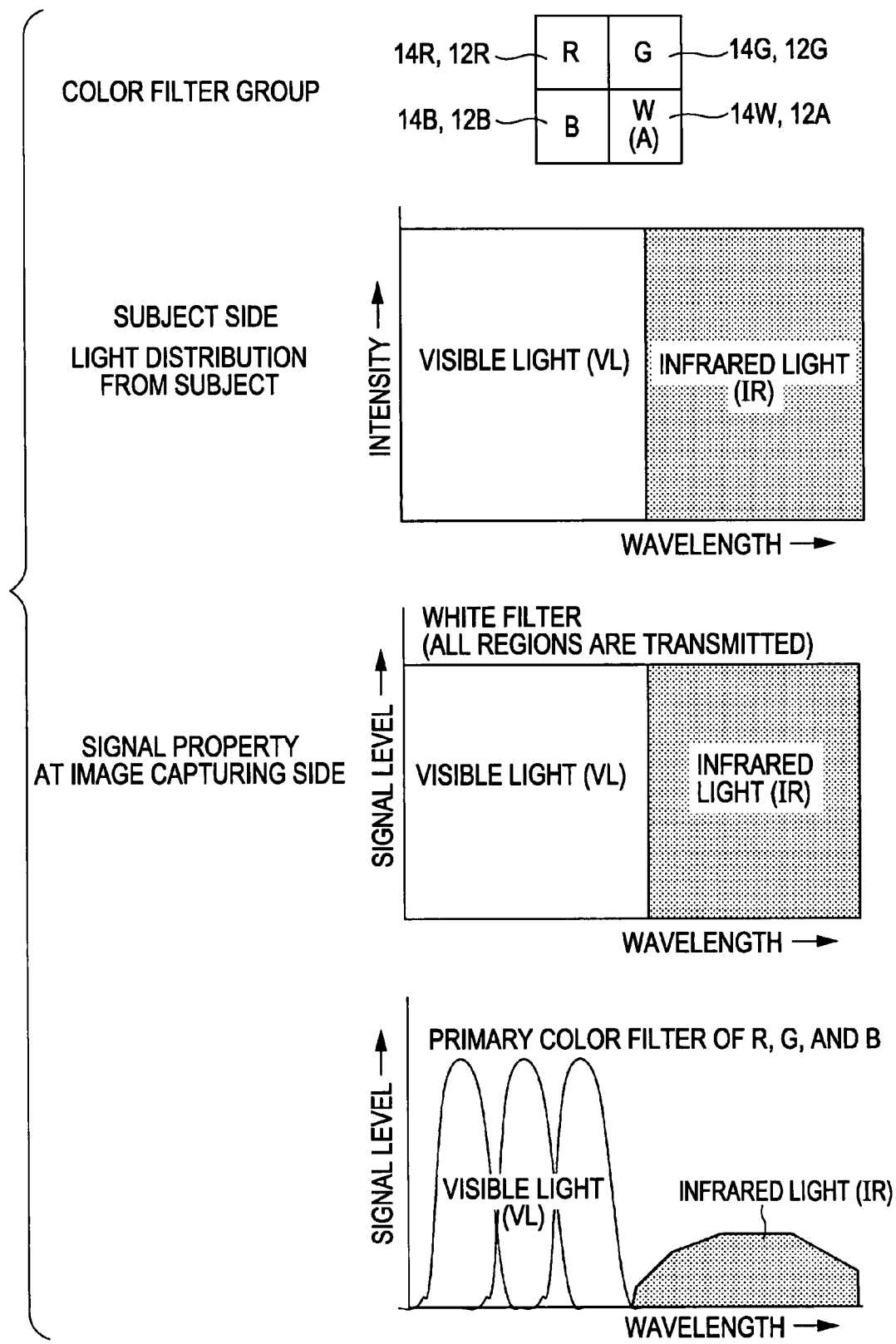
FIG. 3 is a diagram illustrating the basic of optical transparency property (spectral characteristic) of each color filter.
Figure 4:
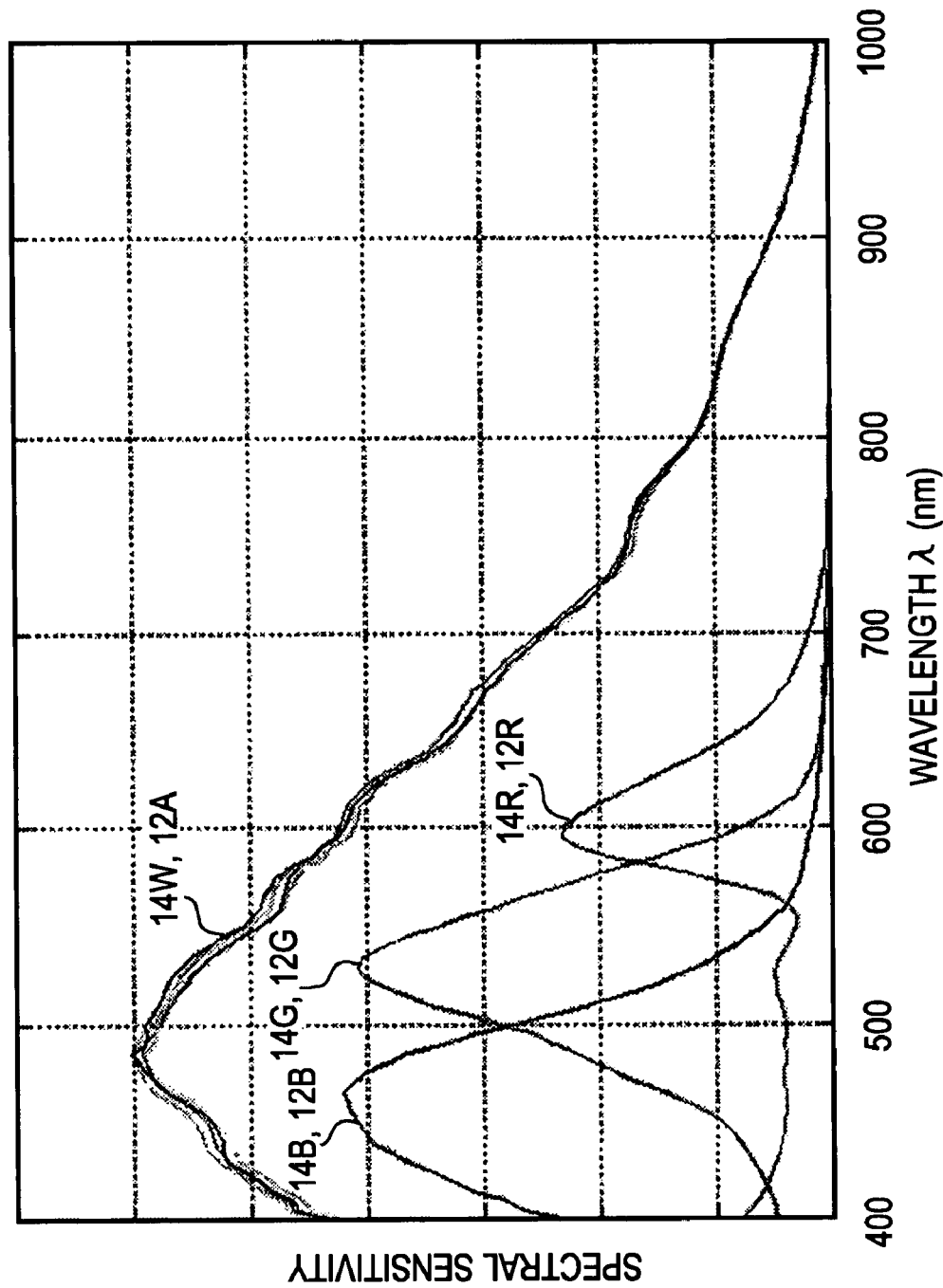
FIG. 4 is a diagram illustrating a property example of each color filter.

FIGS. 3 and 4 are diagrams describing a specific example of wavelength separation. Here, FIG. 3 is a diagram illustrating the basics of the light transmission property (spectral characteristic) of each color filter making up a color filter group. Also, FIG. 4 is a diagram illustrating a property example of each color filter making up a color filter group.

First, the present example illustrates a case wherein as the color filter 14, a color filter group is made up of color filters R, G, B, and W (A) having various types of spectral characteristic of red (R) which transmits the wavelength in the vicinity of red, green (G) which transmits the wavelength in the vicinity of green, blue (B) which transmits the wavelength in the vicinity of blue, and in addition to these, white (W) which transmits infrared light (IR) and all of the RGB (or A employing no color filter).

The spectrum of these color filters 14 is made up of a channel R, channel G, channel B, and channel A which transmits infrared light (IR) and all of the RGB (i.e., Y+IR), and a mosaic image made up of four types of spectrum can be obtained with the corresponding red pixel 12R, green pixel 12G, blue pixel 12B, and the wide wavelength region pixel 12A which detects infrared light (IR) and all of the RGB.

Providing the wide wavelength region pixel 12A enables the synthesized component of infrared light IR and visible light which have entered an image capturing device, i.e., as a wide wavelength region signal SA including both of a luminance signal (Y) and an infrared light signal (IR) of a visible light portion, to be measured.

Note that in FIG. 3, the transmission property of the white filter 14W is illustrated assuming that the transmission property is equal between the visible light band and the infrared light band, but this is not indispensable, the transmission intensity of the infrared light band may be permitted to deteriorate as compared with the transmission intensity of the visible light band. It is desirable for the white filter 14W to transmit the full wavelength components of the visible light band with sufficient intensity, and also to have the property which transmits the infrared light band with sufficient intensity as compared with the transmission intensity of the primary color filters of R, G, and B.

However, the wide wavelength region signal SA obtained from the wide wavelength region pixel 12A includes not only the infrared light component IR but also the visible light component VL, so the infrared light component IR can be employed as a luminance component by employing the wide wavelength region signal SA as it is as compared with the case of generating a luminance signal using the visible light component VL alone, whereby increase in sensitivity can be realized. Particularly, a luminance signal including little noise can be obtained at the time of photography under low illumination, which is an advantage.

Specifically, first, as the color filter 14 for visible light color image capturing, the primary color filter 14 is employed, which is centered on a blue component B (e.g., transmittance is approximately 1 at wavelength $\lambda$=400 through 500 nm, and approximately zero at the others), a green component G (e.g., transmittance is approximately 1 at wavelength $\lambda$=500 through 600 nm, and approximately zero at the others), and a red component R (e.g., transmittance is approximately 1 at wavelength $\lambda$=600 through 700 nm, and approximately zero at the others) which are the three primary colors of the visible light VL (wavelength λ=380 through 780 nm).

Note that the transmittance of "approximately 1" means an ideal state, but it is sufficient that the transmittance at the wavelength region thereof be far greater than the transmittance at the other wavelength regions. There may be transmittance which is not "1" in part. Also, the transmittance of "approximately 0" also means an ideal state, but it is sufficient that the transmittance at the wavelength region thereof be far greater than the transmittance at the other regions. There may be transmittance which is not "0" in part.

Also, it is sufficient to enable passing through of the wavelength region component of a predetermined color (primary color or complementary color) within a visible light VL region which is a passage wavelength region component, but whether to permit passing through of the infrared light IR region which is a reflection wavelength region component, i.e., the transmittance as to the infrared light IR, is irrelevant. This is because the infrared light IR component is cut with the dielectric layer film 1.

As one example, a color filter having spectral sensitivity property such as shown in FIG. 4 can be employed. For example, the blue filter 14B corresponding to the channel B is a filter having a high transmittance as to a light signal having a wavelength of 380 through 480 nm or so which is equivalent to blue, the green filter 14G corresponding to the channel G is a filter having a high transmittance as to a light signal having a wavelength of 450 through 550 nm or so which is equivalent to green, and the red filter 14R corresponding to the channel R is a filter having a high transmittance as to a light signal having a wavelength of 550 through 650 nm or so which is equivalent to red. Note that the color filters 14R, 14G, and 14B corresponding to RGB have properties wherein the infrared light component, having a wavelength equal to or greater than around 700 nm, is hardly transmitted.

On the other hand, the white filter 14W corresponding to the channel A has a property wherein the peak is around 500 nm, but all of the signals of RGB components are transmitted, and also an infrared light component equal to or greater than 700 nm is also transmitted. The wide wavelength region pixel 12A is configured so as to detect a visible light component and an infrared light component with high sensitivity by enabling the corresponding wide wavelength region pixel 12A to detect not only a visible light component but also an infrared light component as compared with the other color pixels (red pixel 12R, green pixel 12G, and blue pixel 12B in the present example) configured to divide the range of a visible light region into multiple components by wavelength to detect each component.

Note that with the present example, taking the white balance of the visible light band at the wide wavelength region pixel 12A into consideration by setting the transmittance of the visible light region of the white filter 14W generally the same as the ratio of the transmittance of each visible light region of the blue filter 14B, green filter 14G, and red filter 14R, an arrangement is made wherein the transmittance of the visible light region at the wide wavelength region pixel 12A is set so as to be higher than those transmittance as a whole, and also the sensitivity itself of the visible light region at the wide wavelength region pixel 12A is set so as to be higher than the sensitivity of the blue pixel 12B, red pixel 12R, and green pixel 12G.

High sensitivity is realized by enabling an infrared light component, which is one example of an invisible light component, to be detectable, and also the visible light region itself is arranged so as to be detectable with high sensitivity as compared with the other color pixels (the red pixel 12R, green pixel 12G, and blue pixel 12B in the present example) each of which is configured so as to divide the range of the visible light region into multiple components by wavelength to detect each component, thereby realizing further high sensitivity.

While description will be omitted regarding the details, a color signal obtained from each of the blue pixel 12B, red pixel 12R, and blue pixel 12B is subjected to correction using the R, G, and B components of the visible light region from the wide wavelength region pixel 12A obtained with such high sensitivity, whereby the color signal of higher sensitivity can be obtained.

Incidentally, with a common image capturing device, a detecting unit such as a so-called photodiode portion of a semiconductor layer is fully considered regarding sensitivity as to a visible light region component, and suitable sensitivity is to be obtained, but sensitivity as to an infrared light component is not fully considered.

For example, as can be apparent from FIG. 4, with the wide wavelength region pixel 12A where the full band passage type white filter 14W corresponding to the channel A, the sensitivity as to a visible light region is sufficient, and it can be understood that the spectral sensitivity curve thereof greatly exceeding the spectral sensitivity curves of the R, G, and B pixels, but on the other hand, it can be also understood that decrease in sensitivity is great at the long wavelength side, and particularly at the infrared light region. For example, it can be understood that with the sensitivity of the wide wavelength region pixel 12A, there is a peak at a wavelength of 500 nm or so, the sensitivity further decreases at the long wavelength side thereof, and the sensitivity becomes half or less at the infrared light region of which the wavelength is equal to or greater than 700 nm. This means that the device configuration of the solid-state image capturing device may be the most appropriate configuration as to the visible light band, but is not a configuration wherein sensitivity can be obtained at a long wavelength up to infrared light, and accordingly, is not the most appropriate configuration as to the long wavelength side.

Therefore, as for the device configuration of a solid-state image capturing device employed for the present embodiment, in order to eliminate such a situation, the following arrangement is employed from the perspective of device to obtain sufficient sensitivity even at a long wavelength region. Specifically, the active region (thickness from the surface) of a detecting unit such as a photodiode is set to a deep portion of the semiconductor layer, and a sensitivity improvement technique is applied so as to obtain sufficient sensitivity even at a long wavelength region. Description will be made below regarding this point.

<Sensitivity Improvement Technique of Long Wavelength Region>

Figure 5A:
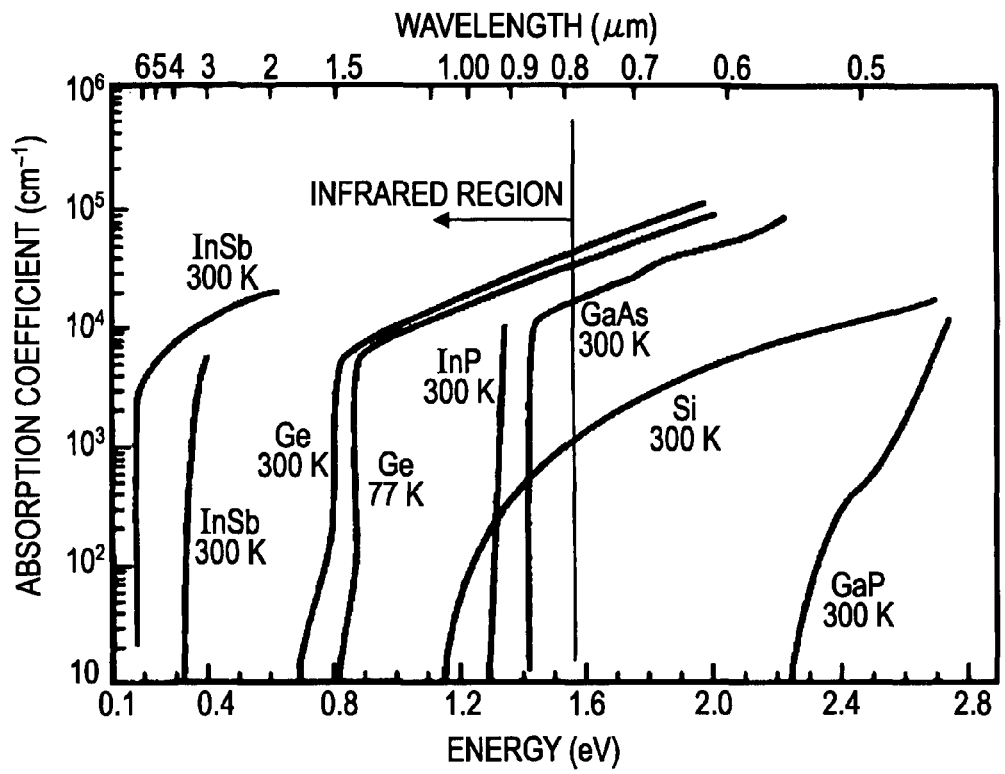
FIGS. 5A and 5B are diagrams describing the wavelength dependency of a absorption coefficient of semiconductor.
Figure 5B:
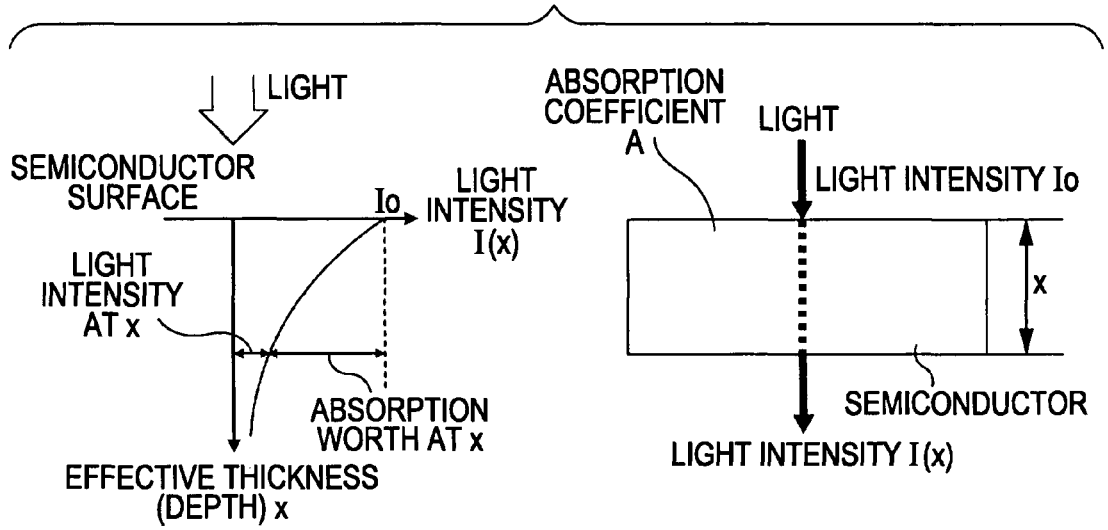
Figure 6:
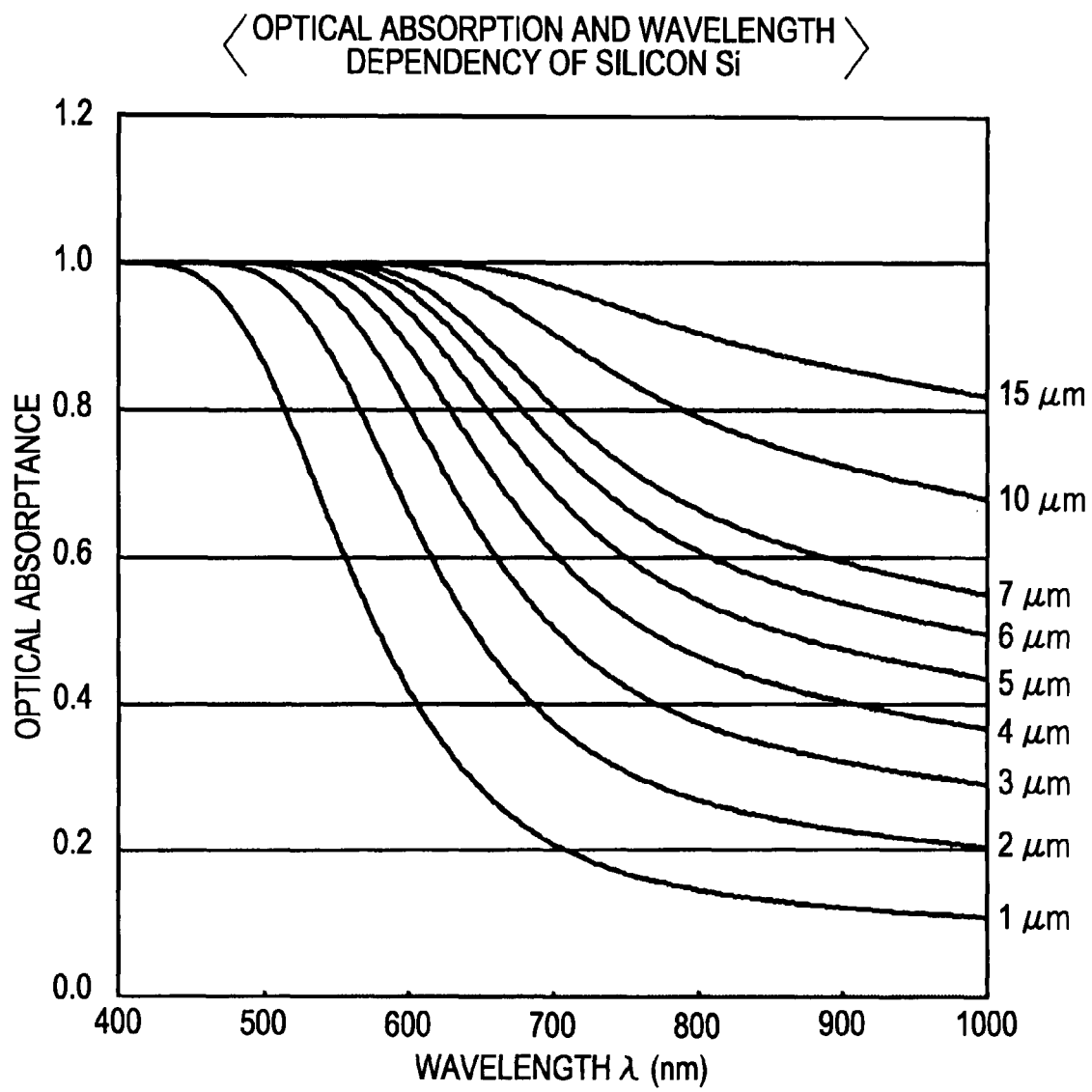
FIG. 6 is a diagram illustrating the property of optical absorbance as to the effective thickness of a detecting unit.
Figure 7:
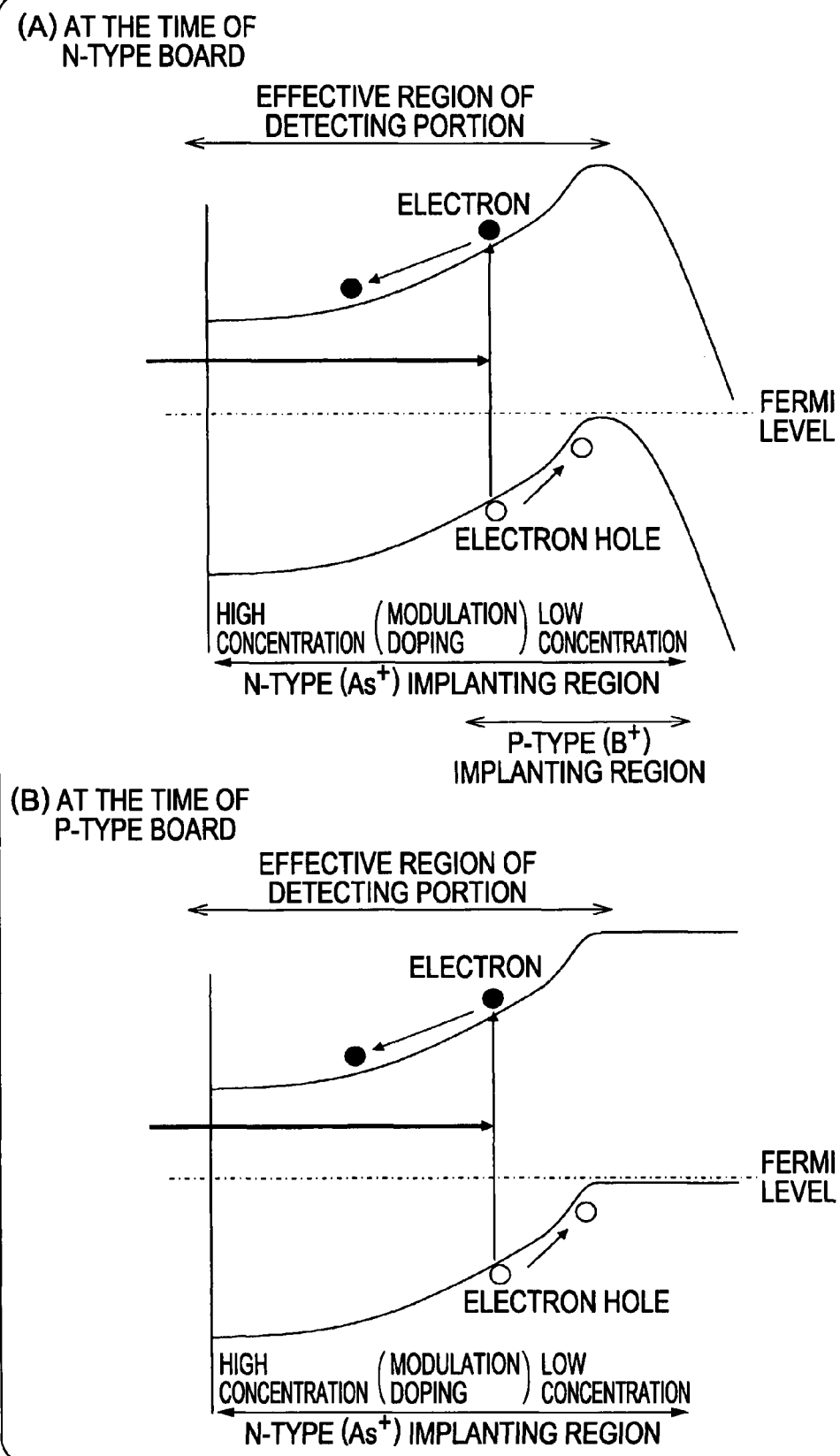
FIG. 7 is a diagram describing doping property in the depth direction of a semiconductor layer.

FIG. 5A through FIG. 7 are diagrams describing a technique for improving sensitivity as a long wavelength region. Here, FIGS. 5A and 5B are diagrams describing the wavelength dependency of the absorption coefficient of each semiconductor such as silicon and so forth. FIG. 6 is a diagram illustrating the property of optical absorbance as to the valid thickness of a detecting unit such as a photodiode or the like. Also, (A) and (B) in FIG. 7 describe doping property in the depth direction of the semiconductor layer. Here, A in FIG. 7 illustrates a case of employing an N-type substrate, and B in FIG. 7 illustrates a case of employing a P-type substrate.

As shown in FIG. 5A, for example, the optical absorption coefficient of an Si (silicon) semiconductor decreases in order of blue, green, red, and infrared light. That is to say, it can be understood that blue light, green light, red light, and infrared light included in an incident light have property wherein the longer a wavelength is, the more the absorption coefficient decreases. In light of this point, the longer a long wavelength component is, the deeper the long wavelength component enters in a deep portion of the semiconductor layer, so if an arrangement is made wherein signal charge can be detected even at such a deep portion, it can be considered to improve sensitivity.

Accordingly, based on FIG. 5A, with silicon Si as an example, let us consider the relation between an active region (thickness from the surface) where a first electroconductive type dopant configured to form a detecting unit such as a photodiode is implanted, and a wavelength with reference to FIG. 5B.

When assuming that an absorption coefficient is A, the light intensity of the semiconductor surface is Io, the light intensity at a depth (active region) x from the surface is I(x), and the absorbance at the depth (active region) x from the surface is B(x), the light intensity I(x) can be represented with Expression (1-1), and the absorbance B can be represented with Expression (1-2), respectively.

$$\left.\begin{array}{l} (x) = Io\ \exp(-Ax)\ \ldots\ (1-1) \\ B(x) = \dfrac{Io - I(x)}{Io} \\ \quad\quad = 1 - \exp(-Ax)\ \ldots\ (1-2) \end{array}\right\} \quad (1)$$

Expression (1-1) represents how the light intensity changes by absorption. That is to say, this expression estimates how the light attenuates by absorption when light passes through the inside of an object of which the absorption coefficient is A such as shown in FIG. 5B. In this case, in the event that the light having the light intensity Io advances distance x, the light intensity at that time can be represented with Expression (1-1).

Accordingly, light intensity equivalent to ΔI attenuated by absorption becomes "Io−I(x)", and this amount absorbed is photoelectric-converted into signal intensity. Consequently, optical absorbance ΔI/Io=B(x) is represented with Expression (1-2).

Here, the absorption coefficient A depends on the wavelength of light, so consequently, the optical absorbance B(x) at a position in distance x from the semiconductor surface also depends on the wavelength of light.

Accordingly, based on the graph representing the wavelength dependency of the absorption coefficient of the semiconductor shown in FIG. 5A, upon optical absorbance being obtained by calculation from the wavelength dispersion property of the absorption coefficient of silicon Si in accordance with Expression (1-1) and Expression (1-2), FIG. 6 is obtained.

Here, in FIG. 6, calculation is performed regarding each valid thickness of 1 through 15 μm, but with a normal sensor configuration employing an N-type substrate which is commonly used now, thin valid thickness up to 3 μm or so from the surface is frequently employed. For example, in the case of 3 μm, the optical absorbance at a wavelength of 800 nm decreases to 0.375, and consequently, determination is made that the sensitivity as this wavelength is low. On the other hand, upon extending an active region to a deep portion of the semiconductor layer, improvement in sensitivity can be realized. For example, upon the active region being set to 5 μm, the optical absorbance increases to 0.543, and accordingly, sensitivity improves for just that much.

Also, not only high sensitivity of the infrared light detecting pixel 12IR is realized, but also which is also combined with high sensitivity correction calculation by an algorithm, whereby it is expectable to attain high sensitivity of several or more times as an image, as compared with a case wherein the present embodiment is not implemented.

Note that in order to extend an active region up to a deep portion of the semiconductor layer, i.e., in order to make the active region of the detecting unit thick, it can be conceived to employ a technique for making the ion implantation region deep. The ion implantation mentioned here means to employ a technique for doping, for example, arsenic (As), which is an N-type dopant, as one example of a first electroconductive type dopant, deeply from the surface using a method for increasing irradiation energy.

For example, taking the relation between the implantation depth and density distribution of ion beams (e.g., see Junzo Ishikawa: "Charged Particle Beam Engineering", Corona Publishing, 2001 issue (first edition) P161) into consideration, the dose and the implantation depth are adjusted.

For example, as shown in Junzo Ishikawa: "Charged Particle Beam Engineering", Corona Publishing, 2001 issue (first edition) P161, with ion beam lithography, beam strength and the structure depth by etching time can be predicted from the projection range of implantation ion. When assuming that the atomic number of implantation ion is Z1, the atomic number of a substrate is Z2, the atomic density of a target is N, the mass number of implantation ion is M1, the mass number of a target is M2, and kinetic energy which ion has is E[kev], a projection range Rp (nm) can be obtained with Expression (2).

$$Rp = \frac{1.1 \times 10^{27}}{N} \cdot \frac{M1 + M2}{3 \cdot M1 + M2} \cdot \frac{(Z1^{2/3} + Z2^{2/3})^{1/2}}{Z1 + Z2} \cdot E \quad (2)$$

Also, an implantation density distribution N(z) can be approximated with a standard deviation a(Rp) centered on the range Rp. Also, the standard deviation a(Rp) of implantation ion can be obtained with Expression (3).

$$\sigma(Rp) = \frac{1}{4} \cdot \frac{3 \cdot M1 + M2}{M1 + M2} \cdot \left(\frac{M2}{M1}\right)^{1/2} \cdot Rp \quad (3)$$

At this time, the atomic density N(Z) of a target can be obtained with Expression (4), assuming that the amount of dose is Nd.

$$N(Z) = \frac{Nd}{2.5 \cdot \sigma \cdot Rp} \cdot \exp\left\{-\frac{(z - Rp)}{2 \cdot \sigma \cdot Rp^2}\right\} \quad (4)$$

The implantation depth of an ion beam can be understood to be in accordance with the projection range Rp, so a dopant can be doped up to a deep portion from the surface by a technique for increasing the kinetic energy E of implantation ion, i.e., to increase irradiation energy, and accordingly, the active region can be thickened.

Note that in order to thicken the active region of a detecting unit, as a result thereof, it is desirable for the active region of the detecting unit to be thickened, this is not restricted to the technique for making an ion implantation region deep, for example, this may be realized by fabricating a part or all of the active region with epitaxial growth. With epitaxial growth, control in the depth direction of concentration can be readily performed as compared with ion beam implantation. On the other hand, ion beam implantation excels in mass productivity.

However, simply thus thickening the active region being causes a problem in signal reading, since it takes time for signal charge (carrier, e.g., electron) generated at a deep portion within a photodiode to move to the surface side.

Accordingly, in the event of employing an N-type substrate, as shown in A in FIG. 7, it is desirable to perform modulation doping so as to decrease the doping concentration of arsenic (As), which is one example of an N-type (first electroconductive type) dopant, proportionately with deepness from the semiconductor surface.

Now, as can be understood from Expression (4), when increasing the projection range Rp, the implantation density distribution N(z) becomes small, and as can be understood from Expression (2), the higher irradiation energy is, the greater the projection range Rp, so at the time of ion implantation, upon irradiation energy being changed gradually (consecutively or in a stepwise manner), it can be thought to realize such modulation doping.

According to such an arrangement, as shown in A in FIG. 7, an internal field having a slope due to the inclination of the band such as facilitating readout of signal charge from a deep side toward the surface is generated. As a result thereof, signal charge generated due to photoelectric conversion within a photodiode can be moved at a high speed at the surface side of the semiconductor substrate using the field having a slope, thereby providing a configuration wherein signal charge generated at a deep side within the semiconductor layer can be converted into an electric signal effectively.

Also, for example, it is desirable to dope boron (B), which is one example of a P-type (second electroconductive type) dopant, further deeply as compared with arsenic (As), which is one example of an N-type (first electroconductive type) dopant. Note that "to dope a P-type dopant deeply as compared with an N-type dopant" as stated here means to make the peak position of concentration of the P-type dopant deeper than the peak position of concentration of the N-type dopant. Thus, the inclination of the band at a deep side within an N-type semiconductor substrate 20 can be further increased, and the advantage of modulation doping can be further improved. As a result thereof, an arrangement is be made wherein the signal charge can be moved to the surface side further effectively to convert into a signal effectively.

Note that in light of attempting to improve light receiving sensitivity as to infrared light, which is one example of a long wavelength region, with regard to a pixel configured to receive infrared light, it is desirable to implement, without fail, the sensitivity improvement technique of a long wavelength region by the active region of a detecting unit being thickened or being subjected to modulation doping using a technique such as performing ion implantation deeply or the like.

On the other hand, in the event of considering a pixel configured to receive visible light, upon the sensitivity improvement technique of a long wavelength region being implemented, at the time of color image capturing, the light receiving sensitivity of the infrared light component which is originally unnecessary for reproduction of a color visible light image improves, which causes a problem. That is to say, it is unnecessary for a visible light pixel to have sensitivity as to infrared light, rather, having sensitivity as to infrared light causes color mixture, and consequently, color reproduction is deteriorated. Infrared light being mixed in a visible light pixel without being shielded results in the color thereof differing from its original color.

In light of this point, in the event of considering a combination with color image capturing, it is not desirable for a detecting unit, which is a visible light pixel, to have a deep active region, and it is desirable to implement the sensitivity improvement technique of a long wavelength region selectively only regarding pixels configured to receive infrared light. For example, it is desirable to apply this sensitivity improvement technique to only the wide wavelength region pixel 12A in the array in FIG. 3, and not to apply this sensitivity improvement technique to pixels for color visible light image of the respective color pixels 12R, 12G, and 12B.

On the other hand, at the time of monochrome image capturing, improvement in sensitivity can be realized by employing the infrared light component as well. In light of this point, in the event of considering a combination with monochrome image capturing, it is desirable to implement the sensitivity improvement technique of a long wavelength region regarding all the pixels.

Note that the above-mentioned description is of the case of employing an N-type substrate, but in practice, a P-type substrate may be employed instead. However, in the case of employing a P-type substrate, as shown in B in FIG. 7, the potential effects which the P-type substrate itself has can be used, so there is no need to dope a P-type dopant deeply, and all that is necessary is to subject an N-type dopant to modulation doping.

Also, the above-mentioned description has been made regarding the case of extracting a signal from the signal charge generated at photoelectric conversion as electron, but conversely, a signal may be extracted from the signal charge generated at photoelectric conversion as a hole, and in this case, the above-mentioned "P type" and "N type" should be read inversely, i.e., to reverse the doping states of the P-type and N-type.

<Manufacturing Method for Improving Sensitivity of Long Wavelength Region>

Figure 8:
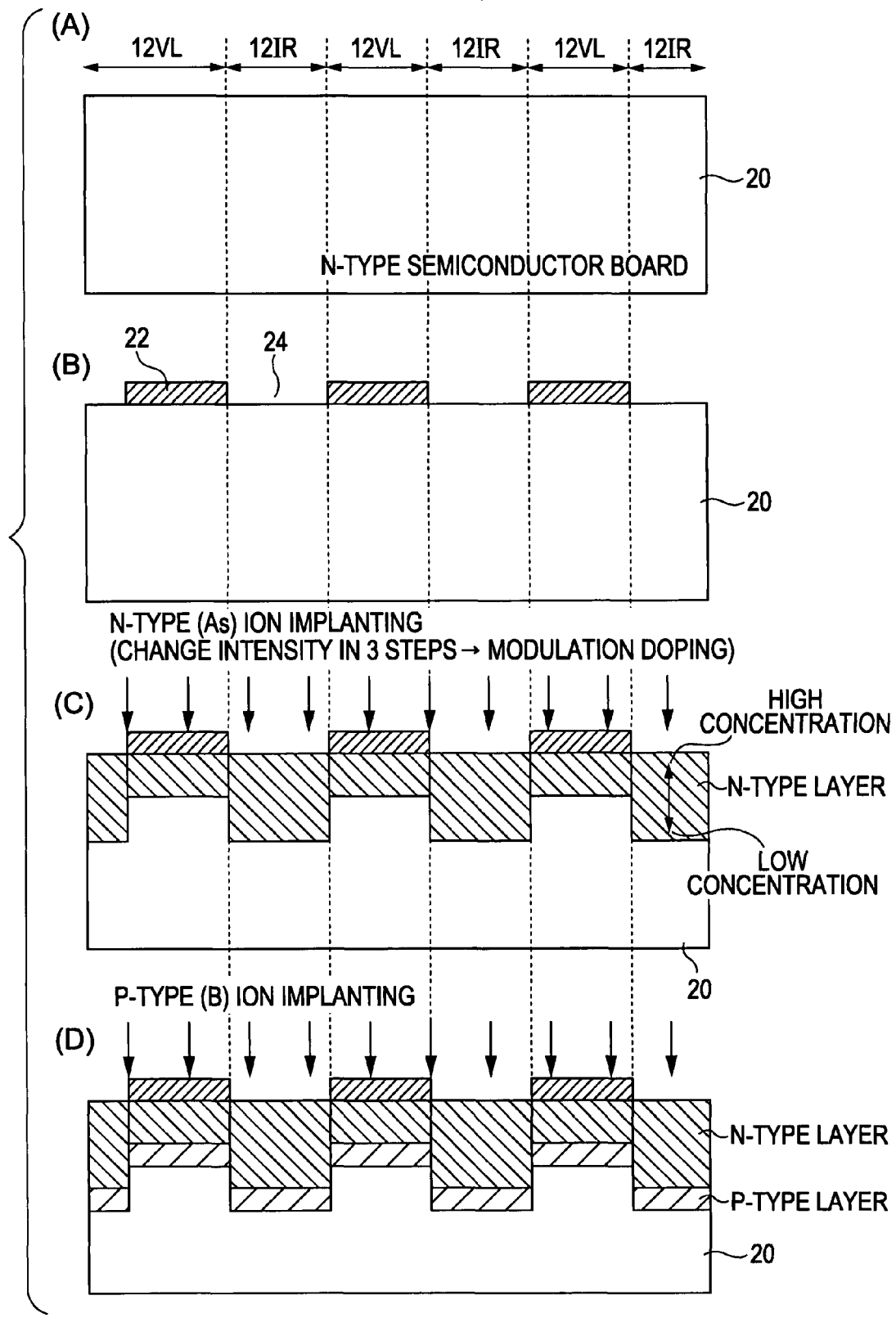
FIG. 8 is a diagram describing one example of a manufacturing method of a solid-state image capturing device capable of realizing improvement in sensitivity of a long wavelength region.

FIG. 8 describes one example of a manufacturing method of a solid-state image capturing device capable of realizing improvement in sensitivity of a long wavelength region. First, as shown in A in FIG. 8, an N-type semiconductor substrate 20 is prepared. Next, as shown in B in FIG. 8, with regard to the visible light detecting pixel 12VL where the color filters C1 through C3 (e.g., each color filter of R, B or G) are disposed and the infrared light detecting pixel 12IR (wide wavelength region pixel 12A) where the color filter C4 is disposed, a control film (hereafter, referred to as a interference film 22) configured to change the depth of ion implantation for each pixel type is formed on the visible light detecting pixel 12VL in the N-type semiconductor substrate 20 beforehand.

The interference film 22 configured to restrict implantation depth as to the implantation of the first electroconductive type dopant exists only on the surface of the N-type semiconductor substrate 20 at a position corresponding to the visible light detecting pixel 12VL of the semiconductor substrate 20. An opening portion 24 is formed on the surface of the N-type semiconductor substrate 20 at a position corresponding to the infrared light detecting pixel 12IR, i.e., the interference film 22 is not formed.

As for the interference film 22, all that is necessary is to include a function for restricting implantation depth as to the implantation of the first electroconductive type dopant, and for example, the interference film 22 may be an oxide film, or a nitride film, or a polymer membrane such as a resist film or the like.

Next, as shown in C in FIG. 8, arsenic (As), which is one example of an N-type dopant, is doped by applying the ion implantation method evenly from the surface side of the N-type semiconductor substrate 20 where the interference film 22 is formed.

At this time, when an ion beam passes through the interference film 22, the energy thereof is attenuated, thereby preventing ion from being implanted deeply, and on the other hand, when an ion beam passes through a portion including no interference film 22, the energy thereof is not attenuated, whereby even in the event that the ion implantation of an N-type dopant is performed upon the whole surface evenly, the depth of ion implantation of the visible light detecting pixel 12VL where the interference film 22 is disposed, and the depth of ion implantation of the infrared light detecting pixel 12IR where the interference film 22 is not disposed, can be selectively changed.

At this time, ion implantation is performed up to a desired position regarding each of the wide wavelength region pixel 12A and the visible light detecting pixel 12VL by controlling the thickness of the interference film 22. For example, while doping a deep portion such as 5 μm from the surface regarding the wide wavelength region pixel 12A, a portion of 3 μm or so from the surface can be doped regarding the visible light detecting pixel 12VL.

Note that with the amount of irradiation energy at this time, first, let us say that a desired depth position can be set to an active region regarding the infrared light detecting pixel 12IR. At the time of this amount of irradiation energy it is desirable to determine the material and thickness of the interference film 22 beforehand so as to set a desired depth position to an active region regarding the visible light detecting pixel 12VL side.

A mask is prepared, the ion implantation process for the wide wavelength region pixel 12A, and the ion implantation process for the infrared light detecting pixel 12IR can be separated and performed with the different irradiation intensity of ion beams, but this case causes a difficulty in that the number of processes increases. On the other hand, the manufacturing method of the present example needs only one ion beam irradiation process, whereby manufacturing time and cost can be reduced.

Also, As ion implantation is performed in a stepwise manner, for example, by changing irradiation energy in three steps, thereby executing modulation doping. According to such an arrangement, for example, regarding a portion of the infrared light detecting pixel 12IR, concentration is set low at a deep portion such as 5 μm from the surface (up to $1 \times 10^{15}$ cm$^{-3}$), and concentration is set high at an even shallower portion (up to $1 \times 10^{17}$ cm$^{-3}$).

The order at the time of changing irradiation energy in a stepwise manner may be changed in a stepwise manner from the high energy side to the low energy side, or conversely, may be changed in a stepwise manner from the low energy side to the high energy side.

Note that conditions necessary for this time such as irradiation energy in three steps need to be set in accordance with the above-mentioned Expression (2) through Expression (4).

Further after this, as shown in D in FIG. 8, boron (B), which is one example of a P-type dopant, is doped evenly from the surface side of the N-type semiconductor substrate 20 by applying the ion implantation method. At this time also, when an ion beam passes through the interference film 22, the energy thereof is attenuated, thereby preventing ion from being implanted deeply, and on the other hand, when an ion beam passes through a portion including no interference film 22, the energy thereof is not attenuated, whereby even in the event that the ion implantation of a P-type dopant is performed upon the whole surface evenly, the depth of ion implantation of the visible light detecting pixel 12VL where the interference film 22 is disposed, and the depth of ion implantation of the infrared light detecting pixel 12IR where the interference film 22 is not disposed, can be selectively changed.

For example, with the wide wavelength region pixel 12A, a portion of 5 through 5.5 μm from the surface is to be doped, and with the visible light detecting pixel 12VL, a portion of approximately 3 through 3.5 μm from the surface can be doped.

Subsequently, following the unnecessary interference film 22 being eliminated, an electrode and the color filter 14 are disposed.

With such a manufacturing method of the present example, the whole surface of the N-type semiconductor 20 is subjected to ion doping all at once, so not only the infrared light detecting pixel 12IR side but also the visible light detecting pixel 12VL side are subjected to modulation doping wherein the deeper from the surface of the semiconductor board, the lower the concentration of a dopant becomes, within the active region where the first electroconductive type dopant is implanted.

Thus, no inconvenience results even in the event of subjecting the visible light detecting pixel to modulation doping. This is because the visible light detecting pixel is thought to also have an advantage in that the signal charge (e.g., electron) generated due to the photoelectric conversion within the active region (i.e., inside of the photoelectric conversion unit) is moved to the surface side with the electric field to convert into a signal effectively.

<Image Capturing Device>

Figure 9:
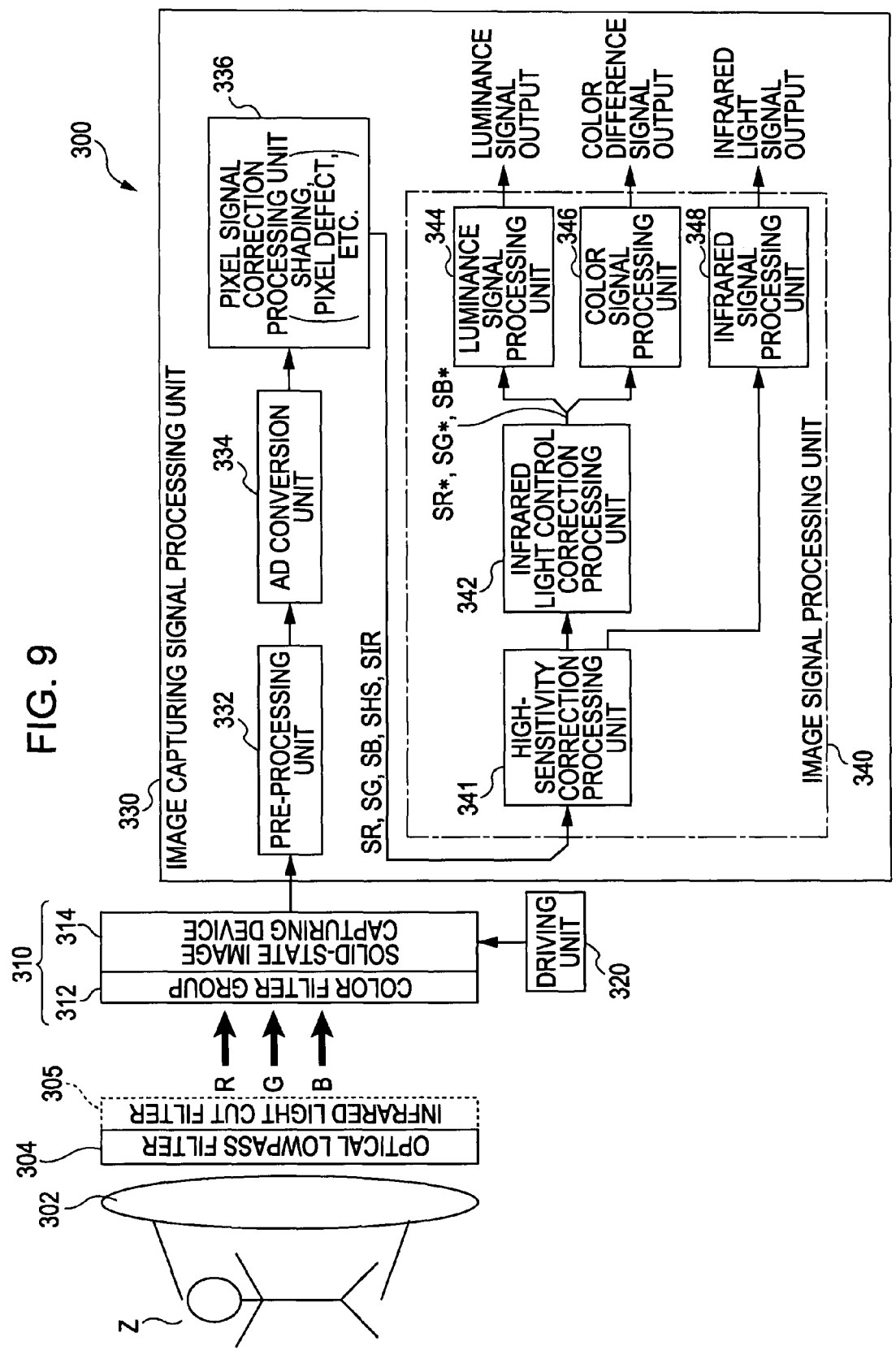
FIG. 9 is a diagram illustrating the schematic configuration of an image capturing device which is one example of a physical information obtaining device.

FIG. 9 is a diagram illustrating the schematic configuration of an image capturing device which is one example of a physical information obtaining device. This image capturing device 300 is an image capturing device configured to obtain a visible color image and an infrared light image independently.

Specifically, the image capturing device 300 includes a photography lens 302 configured to guide light L holding an image of a subject Z to an image capturing unit side to form an image, an optical low pass filter 304, an image capturing unit (solid-state image capturing device) 310 including a color filter group 312 and a solid-state image capturing device (image sensor) 314, a driving unit 320 configured to drive the solid-state image capturing device 314, and an image capturing signal processing unit 330 configured to process the respective image capturing signals SIR (infrared light component) and SV (visible light component) output from the solid-state image capturing device 314.

The optical low pass filter 304 is for shielding a high-frequency component which is equal to or higher than the Nyquist frequency to prevent foldback distortion. Also, as shown with a dotted line in the drawing, an infrared light cut filter 305 configured to decrease infrared light components can be provided along with the optical low pass filter 304. This point is the same as that in a common image capturing device. However, with the present configuration example, the basic configuration is that excluding the infrared light cut filter 305, from the perspective of combination with later-described signal processing.

Also, in the event of employing a configuration wherein a visible light color image and a near-infrared light image are independently obtained, an arrangement including an optical member for wavelength separation (referred to as a wavelength separation optical system) configured to separate light L1 entering through the photography lens 302 into infrared light IR, which is one example of invisible light, and visible light VL, is sometimes employed, but with the present configuration, such an incident light system does not include a wavelength separation optical system configured to perform wavelength separation.

The solid-state image capturing device 314 is an image capturing device made up of a photoelectric conversion pixel group formed in a two-dimensional matrix shape. Note that with the specific configuration of the solid-state image capturing device 314 employed for the present embodiment, the configuration to which the above-mentioned high sensitivity technique regarding a long wavelength region is applied, is employed for at least a semiconductor layer where a detecting unit such as a photodiode or the like is formed. On the other hand, the arrangement of wavelength separation regarding a visible light region which is one example of the first wavelength region component and the infrared light region which is one example of the second wavelength region component is not restricted to any particular arrangement.

The charge corresponding to the infrared light IR, or the charge corresponding to the visible light VL which hold an image of the subject Z, are generated on the image capturing surface of the solid-state image capturing device 314. The operations such as the storing operation of charge, the readout operation of charge, and the like are controlled by a sensor driving pulse signal to be output to the driving unit 320 from an unshown system control circuit.

The charge signal read out from the solid-state image capturing device 314, i.e., the infrared light image capturing signal SIR holding an infrared light image, and the visible light image capturing signal SVL holding a visible light image, are transmitted to the image capturing signal processing unit 330, and subjected to predetermined signal processing.

Here, with the configuration of the present embodiment, the color filter C4 is arranged so as to obtain a high sensitivity signal of which the light use efficiency is high as compared with signals obtained through the color filters C1, C2, and C3, and the infrared light image capturing signal SIR is arranged so as to serve as a high sensitivity image capturing signal SHS (HS stands for "High Sensitivity") as well.

For example, the image capturing signal processing unit 330 includes a pre-processing unit 332 configured to subject a sensor output signal (visible light image capturing signal SVL and infrared light image capturing signal SIR) output from the solid-state image capturing device 314 to pre-processing such as black level regulation, gain regulation, gamma correction, or the like, an AD conversion unit 334 configured to convert an analog signal output from the pre-processing unit 332 into a digital signal, a pixel signal correction processing unit 336 configured to correct shading generated at the photography lens 302, pixel defect of the solid-state image capturing device 314, and so forth, and an image signal processing unit 340.

The image signal processing unit 340 includes a high sensitivity correction processing unit 341 configured to capture an image of the subject Z with a different color and different sensitivity for each pixel in accordance with the array pattern (mosaic pattern) of the color filters C1 through C4, and to convert a color and sensitivity mosaic image wherein a color and sensitivity are formed in a mosaic shape into an image wherein each pixel includes all of the color components, and also has uniform sensitivity.

The high sensitivity correction processing unit 341 obtains a signal indicating luminous quantities (measuring quantity) based on the unit signal of each wavelength detected at a first detecting unit configured to detect a signal through the color filters C1 through C3, and subjects the unit signal (color signal) of each wavelength detected at the first detecting unit to sensitivity correction calculation using the signal indicating luminous quantities, and the signal of each color component of the first wavelength region (visible light region in the present example) having high sensitivity detected at a second detecting unit configured to detect a signal through the color filter C4. This sensitivity correction calculation is realized by multiplying the color signal of each wavelength detected at the first detecting unit by the ratio between the signal indicating luminous quantities and the color signal having high sensitivity detected at the second detecting unit.

Accordingly, though omitted from the drawings, the high sensitivity correction processing unit 341 includes a luminance image generation processing unit configured to generate a luminance image from the color and sensitivity mosaic image obtained by image capturing operation as a signal indicating luminous quantities, and a unicolor image processing unit configured to generate unicolor images R, G, and B using the color and sensitivity mosaic image and the luminance image. Note that in general, processing for generating a luminance image or unicolor image serving as information with uniform color and sensitivity regarding all the pixel positions from a mosaic image serving as image capturing information with different wavelength components (color components) and sensitivity in a mosaic shape, is referred to as demosaic processing.

Also, the high sensitivity correction processing unit 341 includes a high sensitivity correction unit configured to generate unicolor images R, G, and B subjected to high sensitivity correction by subjecting a unicolor image obtained at the unicolor image processing unit to correction using the luminance image (indicating luminance quantities) obtained at the luminance image generation processing unit and the high sensitivity image capturing signal SHS obtained through the color filter C4.

A unicolor image signal generating unit configured to generate a unicolor image wherein all of the pixels to be obtained have the pixel value of each color component by subjecting a color and sensitivity mosaic image to interpolation processing using the pixel signals SR, SG, and SB of the same nearby color based on each color and sensitivity mosaic image obtained through the color filters R, G, and B, color mosaic pattern information indicating the array pattern of the color filters R, G, and B, and sensitivity mosaic pattern information regarding a color component of interest.

Similarly, a luminance image generating unit configured to generate a wide wavelength region image wherein all of the pixels to be obtained have the pixel value of a high wavelength region signal component by subjecting a color and sensitivity mosaic image to interpolation processing using the pixel signal SA of the same nearby color based on a color and sensitivity mosaic image obtained through the color filter C4, color mosaic pattern information indicating the array pattern of the color filter C4, and sensitivity mosaic pattern information, and to use this as a luminance image for all practical purposes.

In the event of the Bayer array wherein the color filter C4 is not provided, and the three primary color filters of R, G, and B are disposed, it is necessary to generate a luminance image by obtaining each estimated value of the three primary color components R, G, and B is obtained based on each color and sensitivity mosaic image obtained through the color filters R, G, and B, color mosaic pattern information indicating the array pattern of the color filters R, G, and B, and sensitivity mosaic pattern information, multiplying each obtained estimated value by a color balance coefficient, adding the multiplication value regarding each color, and regarding the sum thereof as a pixel value, but the present embodiment eliminates such a calculation.

Note that the luminance image generating unit can employ a synthesis calculation technique of R, G, and B. For example, each estimated value of the three primary color components R, G, and B based on a color and sensitivity mosaic image, color mosaic pattern information indicating the array pattern of the color filters C1 through C4, and sensitivity mosaic pattern information, and each estimated value is multiplied by a color balance coefficient. Subsequently, the multiplication value regarding each color is added, the sum thereof is taken as a pixel value, thereby generating a luminance image. Here, color balance coefficients kR, kG, and kB are values which have been set beforehand.

Also, the image signal processing unit 340 includes an infrared light suppression correction processing unit 342 configured to generate a correction visible light image capturing signal SVL* (SR*, SG*, and SB*) by subjecting the visible light image capturing signal SVL to correction using the infrared light image capturing signal SIR (high sensitivity image capturing signal SHS).

Also, the image signal processing unit 340 includes a luminance signal processing unit 344 configured to generate a luminance signal based on the correction visible light image capturing signal SVL* output from the infrared light suppression correction processing unit 342, a color signal processing unit 346 configured to generate a color signal (primary color signal or color difference signal) based on the correction visible light image capturing signal SVL* output from the infrared light suppression correction processing unit 342, and an infrared signal processing unit 348 configured to generate an infrared light signal representing an infrared light image based on the infrared light image capturing signal SIR.

Note that with the configuration example of the present embodiment, the infrared light suppression correction processing unit 342 is provided after the high sensitivity correction processing unit 341, but an arrangement may be made wherein the high sensitivity correction processing unit 341 is provided after the infrared light suppression correction processing unit 342. In this case, the luminance image generating unit provided in the high sensitivity correction processing unit 341 can also serve as the luminance signal processing unit 344, and also the unicolor image processing unit can also be served as the color signal processing unit 346.

The image capturing signal output from the solid-state image capturing device 314 is amplified to a predetermined level by the pre-processing unit 332 of the image capturing signal processing unit 330, and is converted from an analog signal to a digital signal by the AD conversion unit 334. Also, the digital image signal of a visible light component of which the infrared light component is suppressed at the infrared light suppression correction processing unit 342 is further separated into color separation signals of R, G, and B as necessary (particularly, in the case of employing complementary color filters as the color filters C1, C2, and C3), following which converted into a luminance signal or color signal, or a picture signal which is synthesized from a luminance signal and a color signal, and output at the luminance signal processing unit 344 and color signal processing unit 346. Also, the infrared light image capturing signal SIR is subjected to correction at the infrared signal processing unit 348 using the visible light image capturing signal SVL.

Note that with the infrared light suppression correction processing unit 342, the placement position thereof is not restricted to such a configuration as long as the visible light image capturing signal SVL can be subjected to correction using the infrared light image capturing signal SIR. For example, an arrangement may be made wherein the infrared light suppression correction processing unit 342 is provided between the AD conversion unit 334 and the pixel signal correction processing unit 336 configured to perform shading correction and pixel defect correction, and correction which suppresses influence of infrared light is performed before shading correction and pixel defect correction.

Alternatively, an arrangement may be made wherein the infrared light suppression correction processing unit 342 is provided between the pre-processing unit 332 and the AD conversion unit 334, infrared light suppression processing is performed following pre-processing such as black level regulation, gain regulation, gamma correction, or the like, or an arrangement may be made wherein the infrared light suppression correction processing unit 342 is provided between the solid-state image capturing device 314 and the pre-processing unit 332, infrared light suppression processing is performed before pre-processing such as black level regulation, gain regulation, gamma correction, or the like.

According to such an arrangement, the image capturing device 300 captures an optical image representing the subject Z including the infrared light IR by the photography lens 302, captures an infrared light image (near-infrared light optical image) and a visible light image (visible light optical image) in the image capturing unit 310 without separation, converts each of these infrared light image and visible light image into a picture signal, then subjects the picture signal to predetermined signal processing (e.g., color signal separation into R, G, and B components, etc.), and outputs this as a color image signal or infrared light image signal, or a mixture image signal which is synthesized from both signals.

For example, the photography lens 302 is a lens made up of an optical member such as quartz or sapphire or the like which can transmit light of a wavelength of 380 nm or so through 2200 nm or so, captures an optical image including the infrared light IR, and forms an image on the solid-state image capturing device 314 while condensing the optical image.

Also, the image capturing device 300 according to the present embodiment has features in that a detecting unit (image sensor) optimized for detecting the wavelength component which is an original detection target is provided in the image capturing unit 310. Particularly, with the present embodiment, in order to detect the short wavelength side within the visible light VL and infrared light IR, the solid-state image capturing device 314 optimized for detecting the visible light VL is provided.

Here, "optimized image sensor" means to have a configuration wherein first, with regard to a visible light region which is one example of the first wavelength region, a region corresponding to wavelength separation which prevents a wavelength component (a typical example is an infrared light component) other than the wavelength component which is an original detection target from being included in the image capturing signal of the wavelength component which is an original detection target as less as possible is provided on the semiconductor layer where a detecting unit such as a so-called photodiode is formed.

Note that with regard to such an arrangement corresponding to wavelength separation, for example, as the present assignee has proposed in Japanese Patent Application No. 2004-358139, it is desirable to employ a configuration to which the concept of wavelength separation is applied, which subjects an electromagnetic wave to spectrum by a predetermined wavelength using a dielectric layer film. That is to say, it is desirable to employ a spectrum image sensor (spectrum detecting unit) having a configuration wherein at the incident surface side where the electromagnetic wave of the solid-state image capturing device 312 is entered multiple layers each having a predetermined thickness are layered with a different reflective index between adjacent layers, and also a configuration corresponding to wavelength separation employing a dielectric layer film serving as a layer member having property of reflecting a wavelength component (infrared light IR component in the present example) other than the original detection target within incident light (electromagnetic wave), and passing through the remaining (visible light VL component in the present example).

Alternatively, various types of configuration can be employed, such as a configuration wherein a diffraction grating such that the present assignee has proposed in Japanese Patent Application No. 2004-250049 is used to realize wavelength separation, a configuration wherein another arrangement is used to realize wavelength separation, or the like.

However, with a spectrum image sensor having a configuration wherein wavelength separation is performed using a diffraction grating, a great opening portion is provided regarding a portion of a wide wavelength region signal obtaining device, and a minute opening portion for a diffraction grating is provided at a portion of a specific wavelength region obtaining device, but with regard to the portion of the specific wavelength region obtaining device, separation is performed in order of wavelength, so there is little flexibility regarding the layout mode of the specific wavelength region signal obtaining device is small.

Also, in the event of employing a configuration wherein the wide wavelength region pixel 12A configured to also detect an invisible light region component (e.g., infrared light component), and the specific wavelength region signal obtaining device (a combination of the red pixel 12R, green pixel 12G, and blue pixel 12B, or the like) configured to detect a visible light component by separating a visible light component by wavelength are disposed in a two-dimensional matrix shape, the separation performance between an invisible light region component (e.g., infrared light component) and a visible light component might be a problem regarding the specific wavelength region signal obtaining device side from the perspective of color reproduction.

With regard to this point, as proposed in Japanese Patent Application No. 2004-358139 by the present assignee, it is desirable to employ a device substantially having suppression performance of an infrared light component, which has a configuration at the incident surface side where the electromagnetic wave of the first detecting unit enters wherein multiple layers each having a predetermined thickness with a different reflective index between adjacent layers, and also has a configuration wherein a layer member having property of reflecting a predetermined wavelength region component within an electromagnetic wave and enabling the remaining to pass through is disposed.

Also, with regard to the infrared light region which is one example of the second wavelength region, a configuration is employed wherein with a semiconductor layer where a detecting unit such as a so-called photodiode or the like is formed, the light receiving sensitivity of the wavelength component which is an original detection target (infrared light component) is devised from the perspective of the device so as to be improved as compared with the existing configuration. With regard to such a device, as described above, a high sensitivity technique as to the long wavelength region is applied.

The image capturing device 300 according to the present embodiment can capture of an image where the visible light VL and light other than a visible light (infrared light IR in the present example) are mixed, and also can separate and output an image of the visible light VL alone and an image of the infrared light IR alone in some cases, though depending on how to perform signal processing.

Also, the image capturing device 300 is not influenced by the infrared light IR at the time of image capturing of a monochrome image or a color image during the daytime, and also enables image capturing by the infrared light IR to be performed in night or the like. Another image can be output concurrently as necessary. Even in this case, in the daytime, an image of the infrared light IR alone which receives no influence of the visible light VL can be obtained.

For example, a monochrome image of the visible light VL alone which receives almost no influence of the infrared light IR is obtained. Unlike the arrangement described in Japanese Unexamined Patent Application Publication No. 2002-142228, in the event of obtaining a monochrome image of the visible light VL which receives almost no influence of the infrared light IR, there is no need to perform calculation processing with a component of the infrared light IR.

Further, a color filter having a predetermined wavelength transmission property in a visible light region is provided on the solid-state image capturing device 312 so as to correspond to a pixel (unit pixel matrix) as one example of an optical member configured to divide the inside of the visible light VL into predetermined wavelength region components, thereby obtaining an image of a specific wavelength region alone within the visible light region which receives almost no influence of the infrared light IR.

Also, color filters each having different wavelength transmission property in a visible light region are integrally arrayed on multiple photodiodes making up a unit pixel matrix with regularity while matching the position of a photodiode corresponding to each wavelength (according to color), whereby a visible light region can be divided by wavelength (by color), and a color image (visible light color image) of the visible light VL alone which receives almost no influence of the infrared light IR can be obtained base on each pixel signal obtained from these pixels by color.

It is needless to say that a monochrome image of the visible light alone can also be obtained by synthesizing the signals according to wavelength (according to color). An application employing a monochrome image including an infrared light component obtained at the wide wavelength region pixel 12A side, and a monochrome image of the visible light alone can also be realized, and also an image of the infrared light alone can be extracted from the difference between both.

Thus, a monochrome image or color image of the visible light VL, and an "image relating to the infrared light IR" can be obtained independently at any time. The "image relating to the infrared light IR" means an image of the infrared light IR alone which receives almost no influence of the visible light VL, or an image where the infrared light IR and the visible light VL are mixed.

Unlike a simple matrix calculation such as the arrangement described in Japanese Unexamined Patent Application Publication No. 2002-142228, in the event of obtaining a color image of the visible light VL which receives almost no influence of the infrared light IR, correction calculation is performed wherein a signal component obtained by multiplying a signal component SIR including at least the infrared light region component by a predetermined coefficient α is subtracted from a signal component SV of a visible light region, whereby an infrared light component included in a pixel signal of the visible light region can be suppressed accurately.

Also, correction is not performed with a simple estimation such as the arrangement described in Japanese Unexamined Patent Application Publication No. 2003-70009, but rather an infrared light component is actually measured, and a visible light component is subjected to correction using the information thereof, whereby correction can be performed based on the actual situation with a sufficient precision.

Thus, a monochrome image or color image of the visible light VL, and an "image relating to the infrared light IR" can be obtained independently at any time. The "image relating to the infrared light IR" means an image of the infrared light IR alone which receives almost no influence of the visible light VL, or an image where the infrared light IR and the visible light VL are mixed.

Also, image capturing of the infrared light IR alone which receives almost no influence of the visible light VL (monochrome image capturing or color image capturing), and image capturing wherein the infrared light IR and the visible light VL are mixed can be performed simultaneously. Also, according to synthesis processing (more specifically, difference processing) between a component of the visible light VL alone (monochrome image component or color image component) and a component where the infrared light IR and the visible light VL are mixed, image capturing of the infrared light IR alone which receives almost no influence of the visible light VL can also be performed.

Note that the term "receives almost no influence" in the above-mentioned description may be in fact "receives influence somewhat" at a level where it is difficult to sense a clear difference generally by human vision, in light of the fact that judgment of quality ultimately depends on human vision. That is to say, with regard to the infrared light IR side, it is desirable to obtain an infrared image (one example of physical information) capable of ignoring influence of a passage wavelength region (visible light VL), and with regard to the visible light VL side, it is desirable to obtain a normal image (one example of physical information) capable of ignoring influence of the reflection wavelength region component (infrared light IR).

Note that in the event of employing a white filter as the color filter C4, a correction pixel where the color filter C4 is disposed has sensitivity of a wide wavelength region from visible light to infrared light, so the pixel signal thereof is readily saturated as compared with another pixel for visible light image capturing where the color filters C1, C2, and C3 are disposed.

In order to avoid such a problem, it is desirable for the driving unit 320 to control the detection time of the second detecting unit where the color filter C4 is disposed. For example, with image capturing in a bright place, it is desirable to use an electronic shutter function or the like to read out a pixel signal from the detecting unit of a correction pixel with a cycle shorter than usual, and to send this to the pre-processing unit 332. In this case, an effect can be obtained as to saturation by sending the signal at a rate higher than 60 frames per second.

Alternatively, it is desirable to be able to simply read out charge from the detecting unit of a correction pixel in a time period shorter than 0.01667 seconds. In this case, a charge stored substantially in a short time may be read out by discharging a charge signal to the substrate side using overflow. Further preferably, an effect can be obtained as to saturation by sending a signal at a rate higher than 240 frames per second. Alternatively, charge may be simply read out from the detecting unit in a time period (storage time) shorter than 4.16 milliseconds. In either case, it is desirable to prevent a pixel signal output from the detecting unit of a correction pixel from being readily saturated. Note that reading out charge in short time (storage time) to prevent such saturation may be performed only regarding correction pixels, or regarding all of the pixels.

Further, an arrangement may be made wherein a signal read out in a short time is integrated twice or more, thereby converting the weak signal into a strong signal, and improving the S/N ratio. For example, according to such an arrangement, suitable sensitivity and a high S/N ratio can be obtained even regardless of image capturing at a dark place or at a bright place, and consequently, the dynamic range is widened.

Thus, with the image capturing device 300 according to the present embodiment, a visible light color image based on the three primary colors, and an image of the infrared light IR alone or an image where the infrared light IR and the visible light VL are mixed can be simultaneously captured. Also, in the event of employing a white filter as the color filter C4, three primary color signals corresponding to high sensitivity can be obtained by subjecting the signals of three primary color components to correction using a high sensitivity signal obtained at a high sensitivity pixel 12HS, and the high sensitivity signal itself obtained at the high sensitivity pixel 12HS can also be employed as a luminance signal.

However, for example, in the event of employing a sensor configuration using a dielectric layer film, it is difficult to optimize all of the thickness, light receiving sensitivity, color reproducibility, and the like of the device, there is no choice other than a configuration wherein the whole balance is maintained, as a result thereof, with regard to a visible light color image, color reproducibility due to leakage of an infrared light component remains as a problem.

Also, in the event of a spectrum image sensor 511 employing a diffraction grating 501, visible light and infrared light can be separated by using the location dependence by the wavelength in the width direction, but in the vicinity of the boundary between the visible light and the infrared light, separation of the visible light (blue light, green light, and red light) and the infrared light is imperfect, and as a result, color reproducibility due to leakage of an infrared light component remains a problem. Conversely, with regard to an infrared light image, there is influence due to leakage of the visible light component.

In order to solve such a problem, the image capturing device 300 according to the present embodiment includes the infrared light suppression correction processing unit 342 at the image signal processing unit 340, so as to solve the color reproduction problem due to mixture of infrared light at the detecting region where visible light is received. Additionally, improvement is made from the aspect of the semiconductor layer (aspect of the device) such that the light receiving sensitivity of an infrared light component is improved, whereby the correction result employing the infrared light component thereof can exhibit sufficient performance.

According to such a configuration, infrared light which is a component unnecessary for a visible light region can be suppressed and eliminated by signal processing without providing an optical wavelength separation means (a typical example is an infrared light cut filter) before the image sensor. Even in the event that the leakage of infrared light is included in the detection result of the visible light detecting unit, the unnecessary infrared light thereof can be suppressed and eliminated by signal processing, so in the event of realizing an image capturing device capable of obtaining a visible light color image having sufficient color reproducibility, the use range of the image sensor is expanded.

<Image Capturing Device; Corresponding to CCD>

Figure 10A:
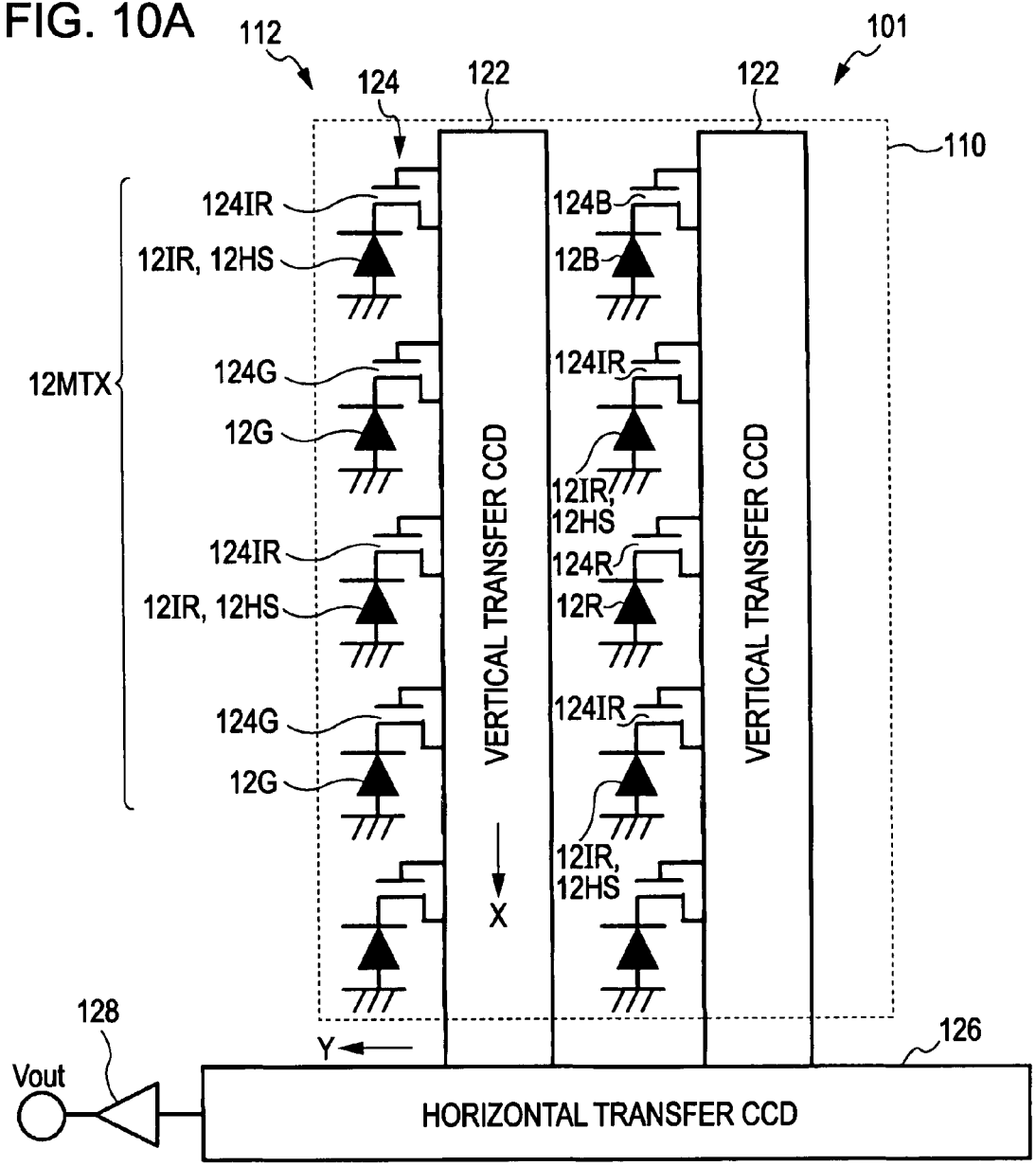
FIGS. 10A and 10B are circuit diagrams of an image capturing device to which a CCD solid-state image capturing device is applied.
Figure 10B:
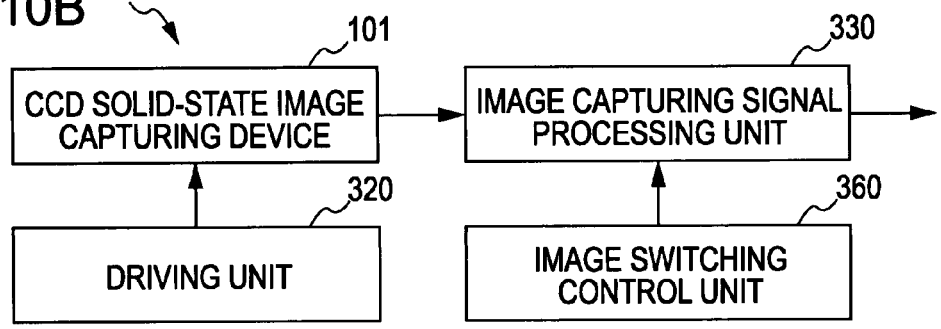

FIGS. 10A and 10B are circuit diagrams of an image capturing device in the case of applying the color separation filter layout shown in FIG. 1 to a CCD solid-state image capturing device (IT_CCD image sensor) employing an interline transfer method.

Here, FIGS. 10A and 10B illustrate a configuration wherein the infrared light IR is detected while dividing the inside of the visible light band into the respective color components of R, G, and B, which is a configuration wherein each of the blue light B, green light G, and red light R within the visible light VL are independently detected, which is essentially a configuration wherein while forming pixels (photoelectric conversion devices) 12B, 12G, and 12R by wavelength within an image matrix 12MTX, there is provided an infrared light detecting pixel 12IR having no wavelength separation configuration, and the infrared light detecting unit 12IR is employed as a correction pixel as to the other pixels.

As for the specific array of the color filter 14, for example, in order to suppress the deterioration of resolution of a wide wavelength region image (i.e., luminance image) obtained at the wide wavelength region pixel 12A, the array shown in B in FIG. 2 is employed.

With a CCD solid-state image capturing device 101, as shown in FIG. 10A, in addition to the pixel matrix 12MTX, there are arrayed and provided multiple vertical transfer CCDs 122 in the vertical transfer direction. Further, a MOS transistor making up a readout gate 124 lies between the vertical transfer CCD 112 and each pixel 12, and also an unshown channel stop is provided at the boundary portion of each unit cell (unit component).

The multiple vertical transfer CCDs 122, which are provided for each vertical column of the sensor unit 112, configured to vertically transfer the signal charge read out by the readout gate 124 from each sensor unit, and the sensor unit 112 make up an image capturing area 110.

The signal charge stored in the pixel 12 of the sensor unit 112 is read out by the vertical transfer CCD 122 of the same vertical column by a driver pulse φROG corresponding to a readout pulse ROG being applied to the readout gate 124. The vertical transfer CCD 122 is transfer-driven, for example, by a drive pulse φVx based on a vertical transfer clock Vx such as three phases through eight phases, and transfers (referred to as line shift) a portion equivalent to one scan line of the readout signal charge at a time in order in the vertical direction using a part of a horizontal blanking period.

With the configuration of the present embodiment, the color filter C4 corresponding to high sensitivity is provided, and thus the infrared light detecting pixel 12IR particularly has a function as a high sensitivity pixel 12HS. Also, with the present example, the high sensitivity pixel 12HS is also the wide wavelength region pixel 12A.

Also, with the CCD solid-state image capturing device 101, there is provided a horizontal transfer CCD 126 (H register unit, horizontal transfer unit) by one line, which is adjacent to each transfer destination side end portion of the multiple vertical transfer CCDs 122, i.e., the vertical transfer CCD 122 of the final line, and extends in a predetermined (e.g., horizontal) direction.

The horizontal transfer CCD 126 is transfer-driven by drive pulses φ1, φH2, for example, based on two-phase horizontal clocks H1 and H2, and transfers the signal charge equivalent to one line transferred from the multiple vertical transfer CCDs 122 in order in the horizontal direction during a horizontal scan period after a horizontal blanking period. Accordingly, multiple (two) horizontal transfer electrodes corresponding to two-phase driving are provided.

At the end portion of the transfer destination of the horizontal transfer CCD 126, for example, an output amplifier 128 including a charge voltage conversion unit having a floating diffusion amplifier (FDA) configuration is provided. The output amplifier 128, which is one example of a physical information obtaining unit, sequentially converts the signal charge horizontally transferred by the horizontal transfer CCD 126 into a voltage signal at the charge voltage conversion unit to amplify and output this with a predetermined level. With this voltage signal, a pixel signal is extracted as CCD output (Vout) corresponding to the incident amount of light from a subject. As described above, the CCD solid-state image capturing device 101 employing an interline transfer method is configured.

The pixel signal extracted from the output amplifier 128 as CCD output (Vout), as shown in FIG. 10B, is input to the image capturing signal processing unit 330. An image switching control signal from an image switching control unit 360, which is one example of a signal switching control unit, is to be input to the image capturing signal processing unit 330.

The image switching control unit 360 instructs switching regarding whether the output of the image capturing signal processing unit 330 should be only any one of a monochrome image or color image of the visible light VL which receives almost no influence of the infrared light IR, and an image of the infrared light IR which receives almost no influence of the visible light VL, or both of these, or a mixture image of the visible light VL and the infrared light IR, i.e., a pseudo-monochrome image or pseudo-color image to which the luminance of the infrared light IR is added. That is to say, the image switching control unit 360 controls simultaneous image capturing output or switching image capturing output between an image of the visible light VL and an image relating to the infrared light IR.

This instruction may be performed by external input for operating the image capturing device, or the image switching control unit 360 may instruct switching by automatic processing based on visible light luminance excluding the infrared light IR of the image capturing signal processing unit 330.

The image capturing signal processing unit 330 performs, for example, synchronization processing for synchronizing the image-captured data R, G, B, and IR of each pixel, striped noise correction processing for correcting a striped noise component caused due to smear phenomenon or blooming phenomenon, WB control processing for controlling white balance (WB) regulation, gamma correction processing for regulating gradation intensity, dynamic range expanding processing for expanding a dynamic range using the image information of two screens having different charge storage time, YC signal generation processing for generating luminance data (Y) and color data (C), or the like. According to such processing, an image of the visible light band (so-called ordinary image) based on the image-captured data (each pixel data of R, G, B, and IR) of primary colors of red (R), green (G), blue (B) is obtained.

Also, the image capturing signal processing unit 330 generates an image relating to the infrared light IR using image data of the infrared light IR. For example, in the event of excluding the color filter C4 so as to allow not only the infrared light IR but also the visible light VL to contribute to a signal at the infrared light detecting pixel 12IR serving as a correction pixel as to the pixels 12R, 12G, and 12B for obtaining a visible light image, an image having high sensitivity is obtained by employing the pixel data from the infrared light detecting pixel 12IR. Also, an image of the infrared light IR alone is obtained by taking the difference with each color component obtained from the pixels 12R, 12G, and 12B.

Each image thus generated is transmitted to an unshown display unit, shown to the operator as a visible image, stored and saved in a storage device such as a hard disk device or the like as it is, or transmitted to another function unit as processed data.

<Specific Example of Sensor Configuration; For CCD>

Figure 11:
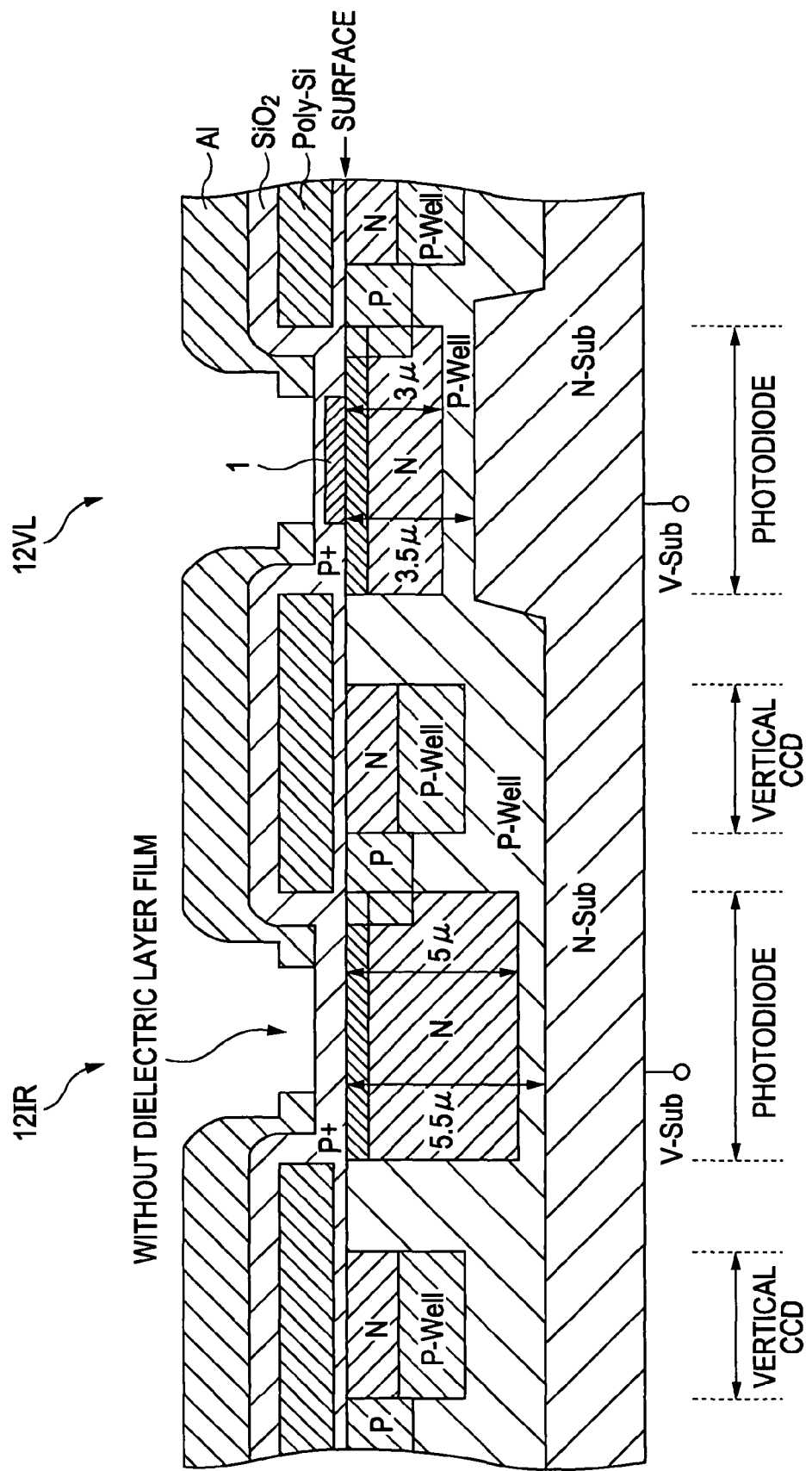
FIG. 11 is a schematic view illustrating the cross-sectional configuration around a substrate surface of the CCD solid-state image capturing device shown in FIGS. 10A and 10B.

FIG. 11 is a schematic view illustrating the cross-sectional configuration of around the substrate surface of the CCD solid-state image capturing device employing the interline transfer method shown in FIGS. 10A and 10B. Here, the visible light detecting pixel 12VL which receives the visible light VL alone (color pixels 12R, 12G, and 12B), and the infrared light detecting pixel 12IR (i.e., pixel 12HS and wide wavelength region pixel 12A) are illustrated.

The infrared light detecting pixel 12IR which receives the mixture of the infrared light IR and the visible light VL has a configuration including neither the dielectric layer film nor the color filter 14. That is to say, with regard to the dielectric layer film, an SiN layer and an SiO layer are sequentially layered using the CVD method, and then removed only at pixels which receive the infrared light IR, using lithography and the RIE method. Subsequently, an SiO2 layer is layered again, and smoothed.

On the other hand, with the visible light detecting pixel 12VL configured to detect the inside of the visible light band by color, an unshown color filter is disposed, and also a dielectric layer film 1 configured to eliminate the infrared light is formed on the semiconductor layer.

With the infrared light detecting pixel 12IR, arsenic (As), which is one example of an N-type dopant, is ion-implanted such that the thickness of the N-type layer of the detecting unit made up of the PN junction is 5 µm from the semiconductor surface. Further, boron (B), which is one example of a P-type dopant, is ion-implanted at 5 through 5.5 µm from the semiconductor surface as a P-Well layer.

On the other hand, with the visible light detecting pixel 12VL, arsenic (As), which is one example of an N-type dopant, is ion-implanted such that the thickness of the N-type layer of the detecting unit made up of the PN junction is 3 µm from the semiconductor surface. Further, boron (B), which is one example of a P-type dopant, is ion-implanted at 3 through 3.5 µm from the semiconductor surface as a P-Well layer.

It has been found that an image of the visible light VL of three primary colors, an image of the infrared light IR alone, or an image of mixture of the infrared light IR and the visible light VL, can be captured simultaneously by employing the CCD image capturing device fabricated with such a configuration. Also, the infrared light detecting pixel 12IR can be configured of high sensitivity.

For example, upon the filter array shown in B in FIG. 2 being employed, the infrared light detecting pixel 12IR can be employed as the wide wavelength region pixel 12A which receives a mixture component of the infrared light IR and the visible light VL, an image of a mixture component of the infrared light IR and the visible light VL can be obtained by employing the pixel data from the wide wavelength region pixel 12A without change, and this is employed as a luminance signal, whereby sensitivity can be improved. Also, the sensitivity of an infrared light component is higher than the existing one, so the effect of sensitivity improvement by employing an infrared light component as a luminance component can be further improved. High sensitivity can be markedly enhanced in an image.

<Image Capturing Device; For CMOS>

Figure 12A:
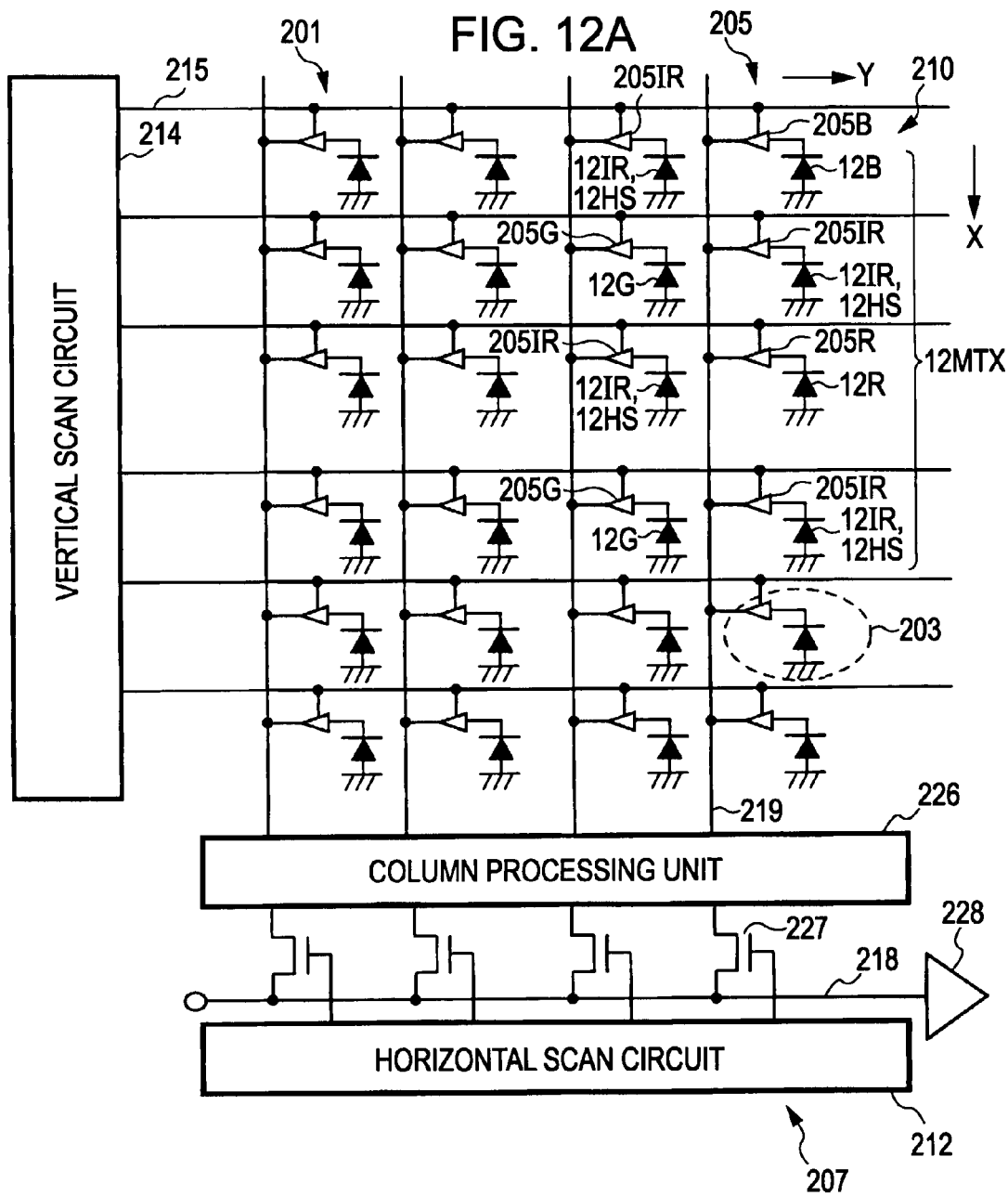
FIGS. 12A and 12B are circuit diagrams of an image capturing device to which a CMOS solid-state image capturing device is applied.
Figure 12B:
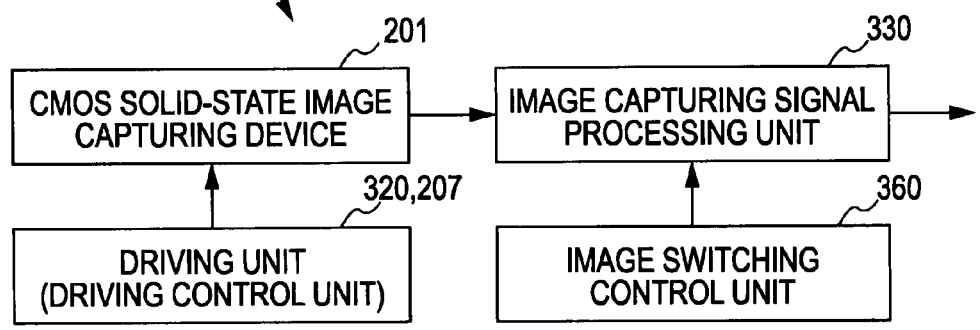

FIGS. 12A and 12B are circuit diagrams of an image capturing device in the case of applying the color separation filter layout shown in FIG. 1 to a CMOS solid-state image capturing device (CMOS image sensor).

Here, FIGS. 12A and 12B illustrate a configuration wherein the infrared light IR is detected while dividing the inside of the visible light band into the respective color components of R, G, and B, which is a configuration wherein each of the blue light B, green light G, and red light R within the visible light VL are independently detected, which is essentially a configuration wherein while forming pixels (photoelectric conversion devices) 12B, 12G, and 12R by wavelength within a single unit pixel matrix, there is provided an infrared light detecting pixel 12IR having no wavelength separation configuration, and the infrared light detecting pixel 12IR is employed as a correction pixel as to the other pixels.

As for the specific array of the color filter 14, as with the case of CCD, for example, in order to suppress the deterioration of resolution of a wide wavelength region image (i.e., luminance image) obtained at the wide wavelength region pixel 12A, the array shown in B in FIG. 2 is employed. In this case, the infrared light detecting pixel 12IR has a function particularly as a pixel 12HS corresponding to high sensitivity (wide wavelength region pixel 12A) by the color filter C4 corresponding to high sensitivity being provided.

In the event of application to CMOS, an arrangement is made wherein one cell amplifier is provided as to each of pixels (photoelectric conversion devices) 12B, 12G, 12R, and 12IR within a unit pixel matrix. Accordingly, this case assumes a configuration such as shown in FIG. 12A. A pixel signal is amplified at the cell amplifier, following which is output through a noise cancel circuit and so forth.

For example, the CMOS solid-state image capturing device 201 includes a pixel unit where multiple pixels including a photo sensor (one example of a charge generating unit) configured to output a signal corresponding to the amount of incident light are arrayed with lines and columns (i.e., in a two-dimensional matrix shape), the signal output from each pixel is a voltage signal, and a CDS (Correlated Double Sampling) processing function unit, digital conversion unit (ADC; Analog Digital Converter), and the like are provided in parallel with columns, which is a typical column type.

Specifically, as shown in FIG. 12A, the CMOS solid-state image capturing device 201 includes a pixel unit (image capturing unit) 210 where multiple pixels 12 are arrayed in lines and columns, a driving control unit 207 which is provided outside the pixel unit 210, a column processing unit 226, and an output circuit 228.

The driving control unit 207 includes a control circuit function for sequentially reading out signals of the pixel unit 210. For example, the driving control unit 207 includes a horizontal scan circuit (column scan circuit) configured to control a column address and column scan, and a vertical scan circuit (line scan circuit) configured to control a line address and line scan.

The horizontal scan circuit 212 has a function serving as a readout scan unit configured to read out a count value from the column processing unit 226. The respective components of the driving control unit 207 are integrally formed along with the pixel unit 210 on a semiconductor region such as a single crystal silicon or the like by employing the same technology as the semiconductor integrated circuit manufacturing technology, and are configured as a solid-state image capturing device (image capturing device), which is one example of a semiconductor system.

The pixel 12 is typically made up of a unit pixel matrix serving as a photo sensor (charge generating unit), and an intra-pixel amplifier (cell amplifier; pixel signal generating unit) 205 (205B, 205G, 205R, and 205IR by wavelength) including a semiconductor device for amplification (e.g., transistor). The pixel signal generating unit 205IR, with the configuration of the present embodiment, has a function as a pixel signal generating unit corresponding to high sensitivity.

Also, as can be understood from FIGS. 12A and 12B, a configuration is made wherein a single unit pixel matrix independently detects the blue light B, green light G, red light R, and infrared light IR, which is essentially a configuration wherein the pixels 12B, 12G, 12R, and 12IR are formed by wavelength (color) within a single unit pixel matrix 12MTX.

The pixel 12 is connected to a vertical scan circuit 214 via a line control line 215 configured to select a line, and also connected to a column processing unit 226 via a vertical signal line 219. Here, the line control line 215 represents overall wiring from the vertical scan circuit 214 to the pixel.

The horizontal scan circuit 212 and the vertical scan circuit 214 are configured including, for example, a shift register or decoder, to start address selection operation (scanning) in response to a control signal provided from a communication and timing control unit unshown in the drawings. In order to realize this, the line control line 215 includes various types of pulse signals (e.g., reset pulse, transfer pulse, drain control pulse, etc.) configured to drive the pixel 12.

The horizontal scan circuit 212 is a circuit configured to sequentially select unshown column circuits within the column processing unit 226 in sync with a clock provided from the communication and timing control unit unshown in the drawings, and to guide the signal thereof into a horizontal signal line (horizontal output line) 218.

The vertical scan circuit 214 is a circuit configured to select a line of the pixel unit 210, and to supply a pulse necessary for the line thereof. For example, the vertical scan circuit 214 includes a vertical decoder configured to stipulate a readout line in the vertical direction (select a ling of the pixel unit 210), and a vertical driving circuit configured to drive the vertical decoder by supplying a pulse to the line control line 215 corresponding to the pixel 12 on the readout address (line direction) stipulated by the vertical decoder. Note that the vertical decoder is configured to select not only a line to read out a signal but also a line for electronic shutter and so forth.

With the CMOS solid-state image capturing device 201 thus configured, the pixel signal output from the pixel 12 is supplied to a column circuit of the column processing unit 226 via the vertical signal line 219 by vertical column. Here, the signal charge stored in the unit pixel matrix (the respective pixels 12B, 12G, 12R, and 12IR) is read out via the vertical signal line 219 of the same vertical column.

Each column circuit of the column processing unit 226 receives a pixel signal equivalent to one column, and processes the signal thereof. For example, each column circuit includes an ADC (Analog Digital Converter) circuit configured to convert an analog signal into, for example, 10-bit digital data using the clock provided from the communication and timing control unit unshown in the drawings.

Also, the circuit configuration is devised such that the pixel signal of the voltage mode input via the vertical signal line 219 can be subjected to processing for obtaining the difference between a signal level (noise level) immediately after pixel reset and a true signal level Vsig (according to light receiving luminance quantities). According to this, a noise signal component such as fixed pattern noise (FPN), and reset noise, can be eliminated.

The analog pixel signal (or digital pixel data) processed at this column circuit is propagated to the horizontal signal line 218 via a horizontal selection switch 217 driven by the horizontal selection signal from the horizontal scan circuit 212, and further input to the output circuit 228.

According to such a configuration, a pixel signal regarding each vertical column is sequentially output for each line from the pixel unit 210 where the unit pixel matrix serving as a charge generating unit (pixels 12B, 12G, 12R, and 12IR) are disposed in a matrix manner. Subsequently, a single image, i.e., a frame image corresponding to the pixel unit 210 where photo sensors are disposed in a matrix manner, is represented with a pixel signal group of the entire pixel unit 210.

The output circuit 228 is a circuit corresponding to the output amplifier 128 in the CCD solid-state image capturing device 101, and after this, as with the CCD solid-state image capturing device 101, as shown in FIG. 12B, the image capturing signal processing unit 330 is provided. As with the case of the CCD solid-state image capturing device 101, the image switching control signal from the image switching control unit 360 is to be input to the image capturing signal processing unit 330.

According to this arrangement, an image of the visible light band (so-called ordinary image) based on the image-captured data of the primary colors of red (R), green (G), and blue (B) (each pixel data of R, G, B, and IR), or pixel data for the visible light VL is obtained, and also an image relating to the infrared light IR can be obtained by employing the pixel data of the infrared light IR.

<Specific Example of Sensor Configuration; For CMOS>

Figure 13:
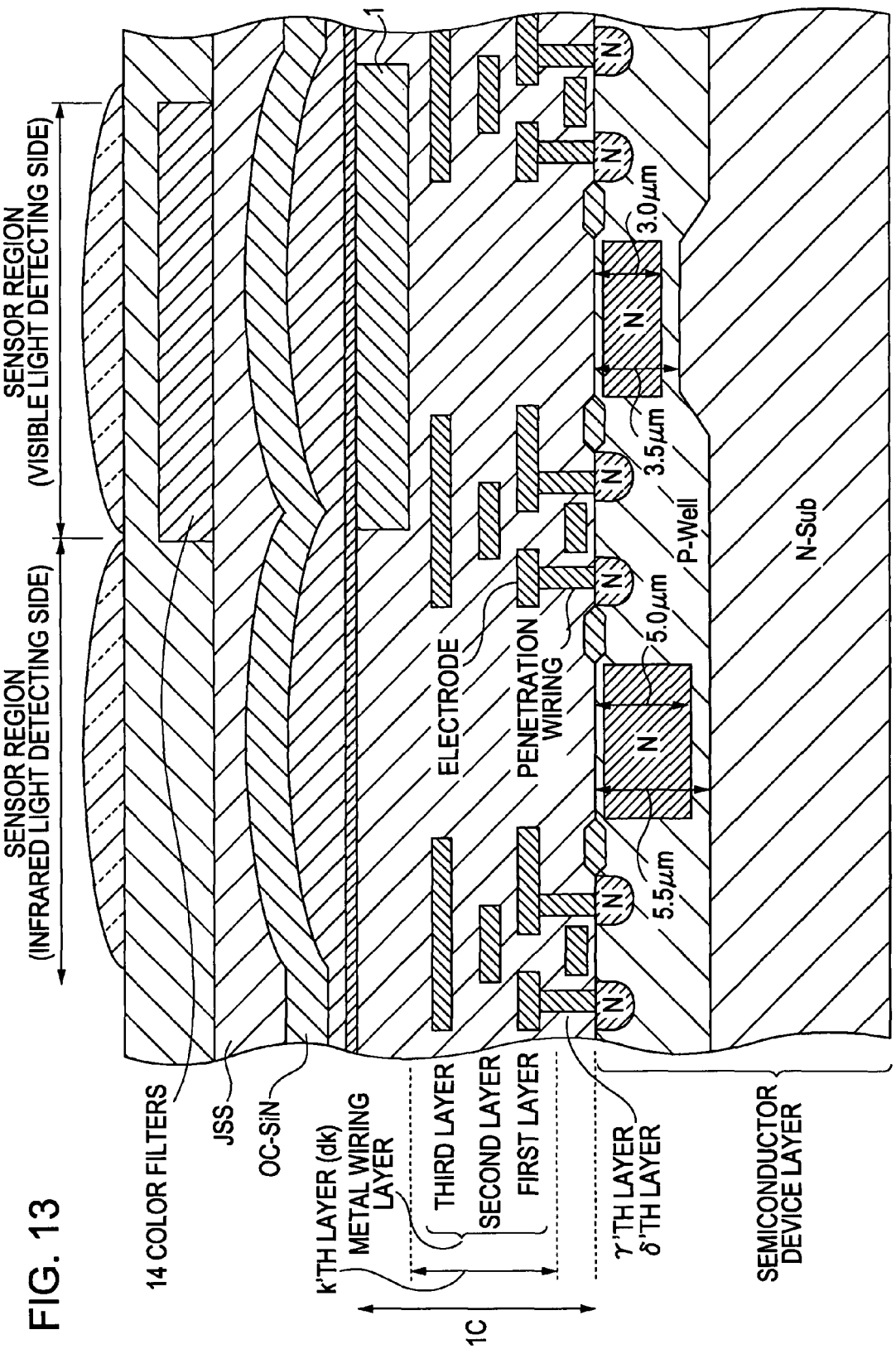
FIG. 13 is a schematic view illustrating the cross-sectional configuration around a substrate surface of the CMOS solid-state image capturing device shown in FIGS. 12A and 12B.
Figure 14:
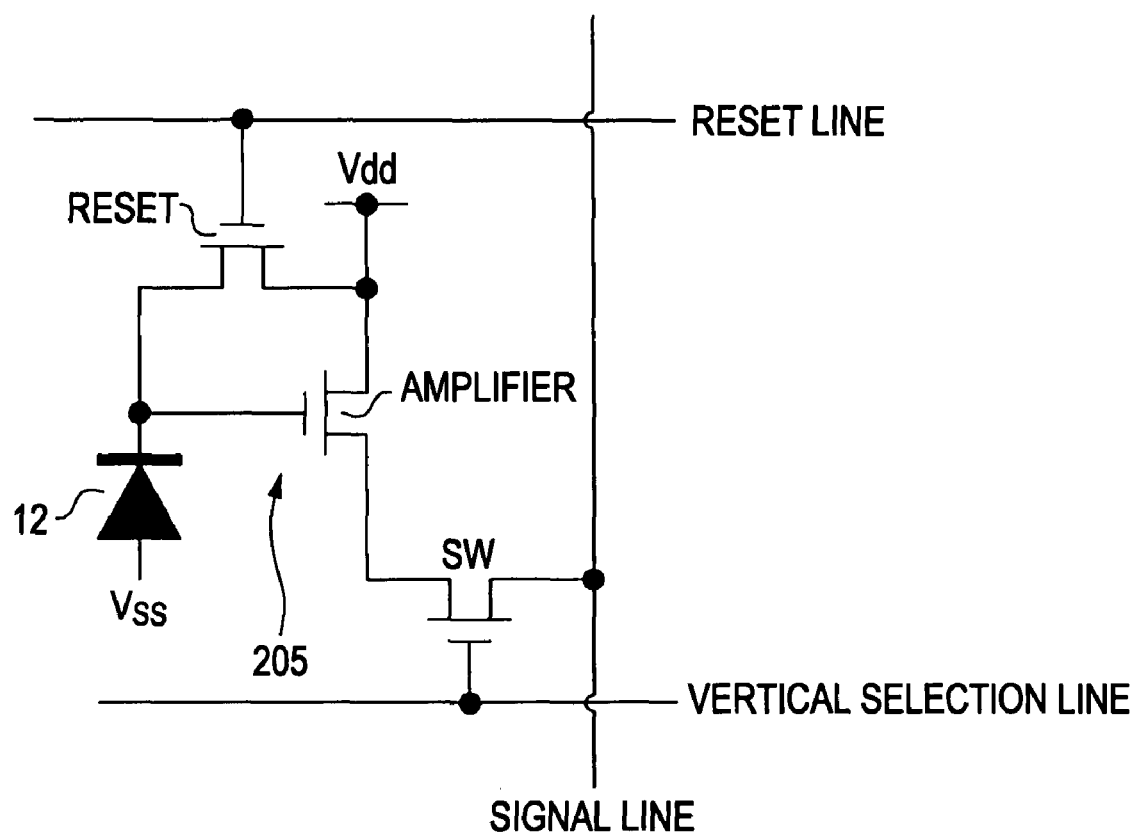
FIG. 14 is a diagram illustrating one example of an amplifier within a pixel according the configuration shown in FIG. 13.

FIG. 13 is a schematic view illustrating the cross-sectional configuration of around the substrate surface of the CMOS solid-state image capturing device shown in FIG. 12. Also, FIG. 14 is a diagram illustrating one example of the intra-pixel amplifier 205 thereof. Here, the visible light detecting pixel 12VL which receives the visible light VL alone (color pixels 12R, 12G, and 12B), and the infrared light detecting pixel 12IR corresponding to high sensitivity (i.e., pixel 12HS and wide wavelength region pixel 12A) are shown.

As for the intra-pixel amplifier 205 of the present example, as shown in FIG. 14, an amplifier is employed, which has a three-transistor configuration including an amplifier transistor configured to convert the signal charge detected at the pixel 12 to output as a pixel signal, a reset transistor configured to reset a pixel in accordance with a rest pulse supplied via a reset line, and a switch (SW) transistor configured to selectively output the pixel signal output from the amplifier transistor in accordance with a vertical selection pulse supplied via a vertical selection line to a signal line.

Note that with the pictorial composition shown here, a dielectric layer film 1 is employed for removing infrared light regarding the visible light detecting pixel 12VL portion, but at this time, metal wiring serving as pixel wiring is taken into consideration, and the dielectric layer film 1 is integrally formed with a detecting unit such as a photodiode on a silicon substrate 1_ω at the upper side, distanced from the silicon substrate 1_ω to some extent.

When considering a CMOS configuration, in the event that there are provided three wiring layers on the semiconductor device where a detecting unit such as a photodiode is formed, and the total thickness thereof is 3.2 μm or so, and in the event of integrally forming a multilayer film configuration on approximately 3.2 μm above the silicon substrate 1_ω where a photodiode and so forth are formed, it is desirable to form the dielectric layer film 1 after the wiring layer process of the third layer which is the uppermost. According to this configuration, a wiring layer can be provided within the k'th layer having thickness of dk=3.2 μm.

The reason why "approximately 3.2 μm" has been described here is that as shown in the drawing, with the present example, an SiO2 layer (6 layer) having thickness of 10 nm or so is provided on the silicon substrate 1_ω, upon which an SiN layer (γ layer) having thickness of 65 nm or so is provided, and "3.2 μm" means the thickness of a k layer excluding these γ and δ layers.

It is desirable to form the color filter 14, a micro lens, and so forth, after this dielectric layer film 1 is formed.

In the case of a CMOS, as with the case of a CCD, with the infrared light detecting pixel 12IR, arsenic (As), which is one example of an N-type dopant, is ion-implanted such that the thickness of the N-type layer of the detecting unit made up of the PN junction is 5 μm from the semiconductor surface. Further, boron (B), which is one example of a P-type dopant, is ion-implanted at 5 through 5.5 μm from the semiconductor surface as a P-Well layer.

On the other hand, with the visible light detecting pixel 12VL, arsenic (As), which is one example of an N-type dopant, is ion-implanted such that the thickness of the N-type layer of the detecting unit made up of the PN junction is 3 μm from the semiconductor surface. Further, boron (B), which is one example of a P-type dopant, is ion-implanted at 3 through 3.5 μm from the semiconductor surface as a P-Well layer.

It has been found that an image of the visible light VL of three primary colors, an image of the infrared light IR alone, or an image of mixture of the infrared light IR and the visible light VL, can be captured simultaneously with high sensitivity, by employing the CMOS image capturing device fabricated with such a configuration, as with the case of the CCD image capturing device.

As described above, with the arrangement of the present embodiment, in the event of preparing for a pixel (infrared light detecting pixel 12IR) where the color filter C4 corresponding to a component at longer wavelength side other than the visible light band (e.g., infrared light component) as well as the wavelength separation filter for the visible light band (color filters C1 through C3), the detection sensitivity of the infrared light detecting pixel 12IR is improved from the perspective of the device.

According to this arrangement, when applying an infrared light component as an invisible light component, infrared light image information which cannot be viewed can be obtained simultaneously, and also can be obtained with high sensitivity as compared with the existing art, and accordingly can sufficiently handle image capturing even in a low luminance environment, for example. Sufficient sensitivity can be obtained regarding not only visible light but also an infrared light component, and also can be read effectively as a signal. Accordingly, even if there is no visible light, e.g., even at night, a clearer image can be obtained by irradiating infrared light to perform image capturing, thereby enabling an application as an image sensor for crime prevention.

Additionally, further improvement in sensitivity and improvement in color reproduction can be realized, and an excellent color image can be readily captured even in a dark place which has not been able to be image-captured until now, by applying an algorithm of correction calculation employing the infrared light component at the subsequent signal processing together with high sensitivity correspondence from the perspective of the device regarding a long wavelength component. Also, good sensitivity as to an infrared light component improves the S/N ratio of the infrared light component used at that time, and also prevents deterioration in S/N ratio due to correction calculation. Also, high sensitivity enables high-speed shutter operation, thereby reducing manual blurring and subject blurring.

Also, not only visible light but also infrared light can be detected simultaneously to form an image. Thus, infrared light image information which cannot be viewed can be received simultaneously so as to correspond to a visible light image which can be viewed. Thus, embodiments of the present invention can be widely applied as key devices to new information systems.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image capturing device, comprising:
 a first detecting unit configured to detect a first wavelength component; and
 a second detecting unit configured to detect a second wavelength component which has a longer wavelength than said first wavelength component;
 and wherein, in the depth direction, an active region where a first type dopant of said second detecting unit is formed reaches deeper than an active region where said first type dopant of said first detecting unit is located; and further wherein a signal processor modifies an output signal from at least one detecting unit based on a received signal quantity at another detecting unit and a type of filter above at least one of the detecting units.

2. The solid-state image capturing device according to claim 1, wherein an active region where the first type dopant is subjected to modulation doping, whereby the deeper from the surface, the lower the concentration of said dopant.

3. The solid-state image capturing device according to claim 2, comprising:
 wherein both detecting units are subjected to said modulation doping.

4. The solid-state image capturing device according to claim 2, wherein a second electroconductive type dopant is formed such that a peak position of concentration of said second electroconductive type dopant is deeper than a peak position of concentration of said first electroconductive type dopant.

5. An image capturing device comprising:
 a first detecting unit configured to detect a first wavelength component; and
 a second detecting unit configured to detect a second wavelength component which is longer than at least said first wavelength component;
 and wherein, a first type dopant of said second detecting unit reaches a portion deeper than a dopant of said first detecting unit; and
 a correction processing unit configured to subject a signal obtained at said first detecting unit to correction using a signal obtained at said second detecting unit and further wherein a signal processor modifies an output signal from at least one detecting unit based on a received signal quantity at another detecting unit and a type of filter above at least one of the detecting units.

6. The image capturing device according to claim 5, wherein at least a first type dopant that is formed in the depth direction is subjected to modulation doping, whereby the deeper from a substrate surface, the lower the concentration of said dopant.

* * * * *